United States Patent [19]

Nishizawa et al.

[11] Patent Number: 4,994,872
[45] Date of Patent: Feb. 19, 1991

[54] INSULATED GATE STATIC INDUCTION TRANSISTOR AND INTEGRATED CIRCUIT INCLUDING SAME

[75] Inventors: Jun-ichi Nishizawa; Tadahiro Ohmi, both of Sendai, Japan

[73] Assignee: Zaidan Hojin Handotai Kenkyu Shinkokai, Sendai, Japan

[21] Appl. No.: 225,870

[22] Filed: Jul. 29, 1988

Related U.S. Application Data

[60] Division of Ser. No. 814,030, Dec. 23, 1985, which is a continuation of Ser. No. 570,440, Jan. 16, 1984, abandoned, which is a continuation of Ser. No. 167,343, Jul. 10, 1980, abandoned, which is a continuation of Ser. No. 867,298, Jan. 5, 1978, abandoned.

[30] Foreign Application Priority Data

Jan. 11, 1977 [JP] Japan .................................. 52-1756
Jan. 18, 1977 [JP] Japan .................................. 52-4633
Oct. 1, 1977 [JP] Japan .............................. 52-118380

[51] Int. Cl.$^5$ ............................................. H01L 29/10
[52] U.S. Cl. .................................. 357/23.4; 357/23.3; 357/24; 357/22; 357/43
[58] Field of Search .................... 357/23.3, 43, 24, 22, 357/23.4

[56] References Cited

U.S. PATENT DOCUMENTS 4,317,127 2/1982 Nishizawa ............................ 357/42
4,814,843 3/1989 Nishizawa ............................ 357/24

Primary Examiner—Rolf Hille
Assistant Examiner—Roy K. Potter
Attorney, Agent, or Firm—Cushman, Darby & Cushman

[57] ABSTRACT

An insulated-gate static induction transistor is formed by establishing a potential barrier in a semiconductor region of one conductivity type between the source and the drain regions of the other conductivity type. The height of the potential barrier should be sensitive to the drain voltage as well as to the gate voltage. Therefore, the semiconductor region should have a low impurity concentration and short length. The potential barrier can be established by varying the field effect of the gate voltage in the semiconductor region and/or by the built-in potential between the source region and the semiconductor region.

10 Claims, 19 Drawing Sheets

INSULATED GATE STATIC INDUCTION TRANSISTOR AND INTEGRATED CIRCUIT INCLUDING SAME

This is a division of application Ser. No. 06/814,030, filed Dec. 23, 1985; which which is a continuation of Ser. No. 06/570,440 filed Jan. 16, 1984, abandoned; which was a continuation of Ser. No. 06/167,343 filed July 10, 1980, abandoned; which was a continuation of Ser. No. 05/867,298 filed Jan. 5, 1978, abandoned.

RELATED APPLICATIONS

This application is related to Nishizawa application Ser. No. 06/020,498 filed Mar. 14, 1979, now U.S. Pat. No. 4,334,235 issued June 8, 1982; Nishizawa et al application Ser. No. 07/082,979 filed Aug. 4, 1987, which is a continuation of Ser. No. 06/669,741 filed Nov. 7, 1984, abandoned, which was a continuation of Ser. No. 06,238,968 filed Feb. 27, 1981, abandoned, which was a continuation of Ser. No. 06/032,219 filed Apr. 23, 1979, abandoned; and Nishizawa et al application Ser. No. 07/062,333 filed June 9, 1987, which is a continuation of Ser. No. 06/179,782 filed Aug. 20, 1980, abandoned.

BACKGROUND OF THE INVENTION (a) Field of the Invention

The present invention relates to a semiconductor device, and more particularly it pertains to an insulated-gate static induction transistor, and also to a semiconductor integrated circuit including the same.

(b) Description of the Prior Art

Conventional ordinary field effect transistors of both junction and insulated gate types show saturated drain current vs. drain voltage characteristics, i.e. the drain current becomes saturated with an increase in the drain voltage.

A new type of the field effect transistor, i.e. the static induction transistor, was proposed by one of the present inventors, e.g. in U.S. Pat. application Ser. Nos. 817,052 and 576,541 and in IEEE Trans. on Electron Devices, ED-22, pp.185-197 April 1975.

The static induction transistor (referred to as SIT hereinbelow) has a distinguishing feature that the drain current keeps growing with an increase in the drain voltage at least in a portion of the main operative state regardless of the gate bias voltage. The static induction transistor has the following advantages over the ordinary field effect transistors (referred to as FET, hereinbelow).

(1) At least in a portion of the main operative state, the region between the source and the drain is not punched through, i.e. there remains a neutral region between the source and the gate which is not depleted, and the product of the series resistance $r_s$ and the true transconductance $G_m$ is less than one to exhibit an unsaturating drain current vs. drain voltage characteristic in a low drain current region.

(2) The unsaturating drain current vs. drain voltage characteristic provides a high input impedance, a low output impedance, a large apparent transconductance $g_m$ and less distortion in the signal transfer.

(3) A large output current can be supplied. Also, a high breakdown voltage can be provided by using a high resistivity layer in a predetermined portion. Thus, a high power element with a large output current and a high breakdown voltage can be provided.

(4) The gate region may have a high impurity concentration, and the dimension of the gate structure can be minimized. Thus, both the parasitic capacitance and the resistance of the gate can be reduced to improve high-frequency and high-speed performance.

(5) The amplification factor can be maintained substantially constant in a very wide gate voltage region and in a very wide drain voltage region from a low drain current region in which the drain current vs. drain voltage characteristic fundamentally follows an exponential formula to a high drain current region in which the drain current vs. drain voltage characteristic becomes substantially linear due to an increase in the voltage drop across the series resistance $r_s$. This unsaturating drain current region may extend over more than ten orders of magnitude. Thereby, operation with very low distortion is feasible.

(6) The amplification factor can be maintained substantially constant down to a very small drain current region. Thereby, an excellent switching operation can be achieved in a low current and low power consumption state.

(7) Temperature dependency of the drain current may be rendered negative at large drain currents. Thereby, thermal runaway can be prevented. Also, active structures which have almost no temperature dependency can be designed.

(8) The amplification factor can be maintained substantially constant through a very wide temperature range, e.g. over two hundred degrees centigrade.

(9) High speed switching operation can be performed by narrowing the channel width and decreasing the impurity concentration in the channel so that almost no current is allowed to flow at zero gate bias and that a current is allowed to flow when a forward bias voltage is applied to the gate.

(10) High-speed operation can be enhanced by shortening the source-drain distance so that the transit time of carriers therebetween is reduced.

The high input impedance feature allows direct coupling of the succeeding amplifier stages and the non-requirement for the driving power enhances the integration density in an integrated circuit (IC). Furthermore, the large transconductance together with the unsaturating drain current vs. drain voltage characteristic allows a large fan-out, which is extremely fitted for IC and LSI.

As can be seen from the above, the SIT has excellent features in high power, high voltage, large current low distortion, low noise, low power dissipation and/or high speed operation. Together with its temperature dependence, the SIT has many advantages over the conventional bipolar and field effect transistors. Superiority of the SIT as a discrete active element and as an element in IC has been proved and its utility is being developed in various fields.

However, the developments of the SIT made heretofore are mainly concentrated to junction SITs and depletion mode MOS SITs.

In the conventional insulated-gate (hereinafter referred to as IG) FET of enhancement mode, the length and the width of the channel which is formed with an inversion layer are long and narrow, respectively, so that the drain current is saturated for drain voltages above a certain drain voltage. Furthermore, the potential profile in the channel from the source to the drain is monotonic and has no maximum.

SUMMARY OF THE INVENTION

Therefore, an object of the present invention is to provide an insulated-gate static induction transistor which can operate in the enhancement mode or the enhancement/depletion mode.

Another object of the present invention is to provide a semiconductor integrated circuit structure including an insulatedgate static induction transistor which operates in the enhancement mode or the enhancement/depletion mode.

According to an aspect of the present invention, there is provided an insulated-gate static induction transistor comprising a semiconductor region of one conductivity type having a low impurity concentration, source and drain regions of the opposite conductivity type provided at separate portions of the semiconductor region, and a gate structure for suppressing the Fermi level in said semiconductor region with a potential barrier remaining in the neighborhood of the source region, thereby allowing a current to flow by charge carriers injected from the source over the potential barrier to the drain.

The potential barrier may be formed by utilizing the built-in potential between the source region and the semiconductor region and/or varying the field effect of the gate voltage. The semiconductor region has a low impurity concentration and a short length along the direction from the source to the drain. An inversion layer is induced under the gate electrode by the gate voltage. When a drain voltage is applied, carriers in the inversion layer between the potential barrier and the drain are easily drawn to the drain to leave such region depleted. Then, the drain voltage influences on the height of the potential barrier, and the carriers injected over the potential barrier are drawn to the drain.

BRIEF DESCRIPTION OF THE DRAWINGS

FIGS. 1a to 1e illustrate an example of the static induction transistor (SIT) proposed by one of the present inventors, in which: FIG. 1a is a schematic cross-section of an SIT, and FIGS. 1b to 1e are characteristic diagrams of the SIT shown in FIG. 1a.

FIGS. 16a to 16e show IIL circuits utilizing J-SIT's proposed by one of the present inventors, in which FIGS. 16a and 16d are circuit diagrams, FIGS. 16b and 16c are characteristic diagrams of the injector and the driver SIT of FIG. 16a, and FIG. 16e is a characteristic diagram of an additional SIT in the circuit of FIG. 16d.

DETAILED DESCRIPTION OF THE PREFERRED EMBODIMENTS

In order to help understanding of the present invention, an example of the junction static induction transistor (J-SIT) will be described briefly first, and then embodiments of the present invention will be described.

Figure 1A:
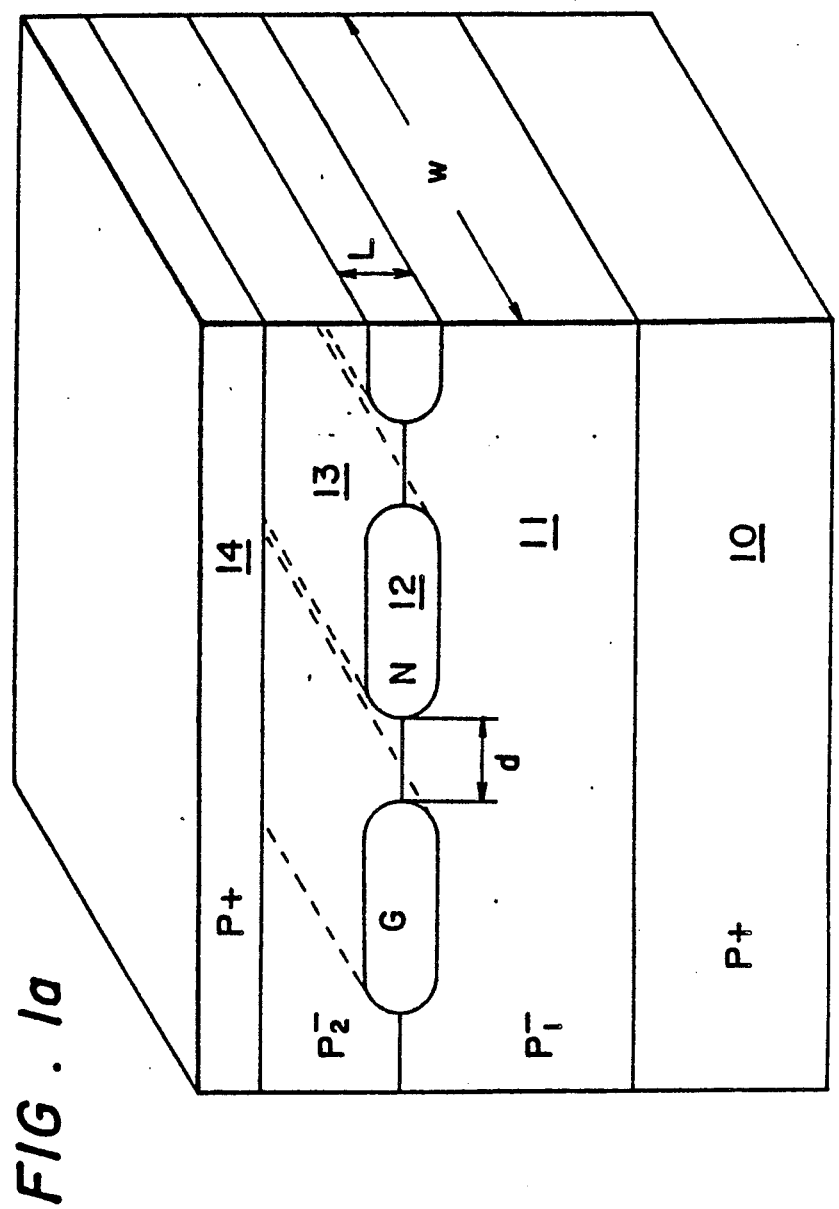
Figure 1B:
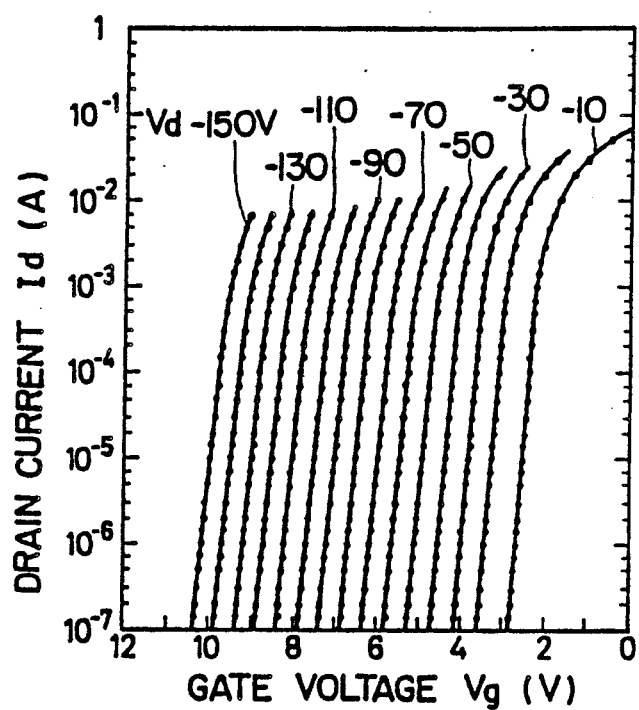
Figure 1C:
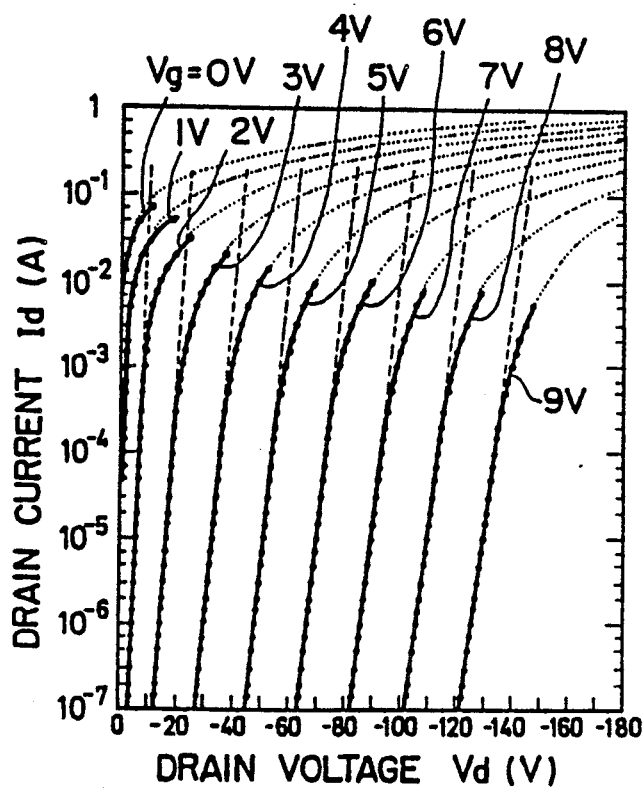
Figure 1D:
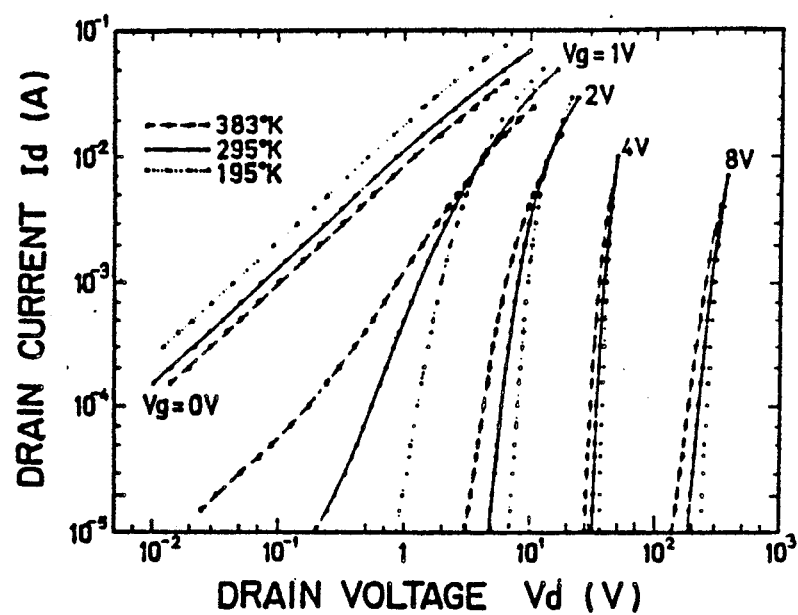
Figure 1E:
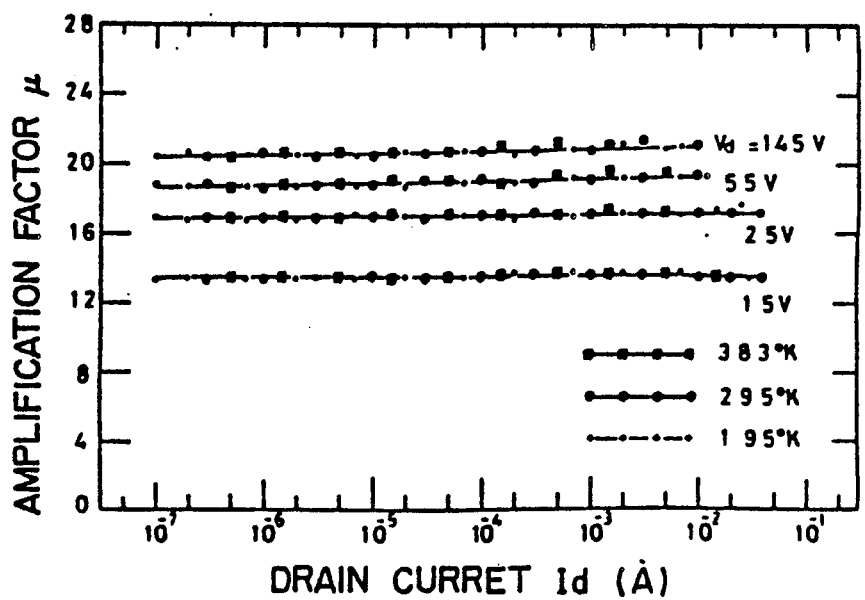

FIGS. 1a, 1b, 1c, 1d and 1e show the structure, the drain current vs. gate voltage characteristic, the drain current vs. drain voltage characteristic, the temperature dependency of the drain current vs. drain voltage characteristic and the temperature and drain current dependency of the amplification factor, respectively, of a p-channel J-SIT. In FIGS. 1b and 1c, the ordinate is represented in logarithmic scale. In FIG. 1d, both the ordinate and abscissa are represented in logarithmic scale. In FIG. 1e, the abscissa is represented in logarithmic scale.

FIG. 1a shows a concrete example of a p-type multi-channel J-SIT. In the figure, a $p^-$ type epitaxial layer 11 having an impurity concentration of about $1.5 \times 10^{14}$ cm$^{-3}$ is grown on a $p^+$ type substrate 10 having an impurity concentration of around $1 \times 10^{19}$ cm$^{-3}$ and serving as a drain region. On the $p^-$ type region 11, another $p^-$ type region 13 is epitaxially grown with an impurity concentration of about $2 \times 10^{15}$ cm$^{-3}$. Here, $n^+$ type gate regions 12 having a maximum impurity concentration (at the core) of about $5 \times 10^{18}$ cm$^{-3}$ are embedded between the two $p^-$ type regions 11 and 13 as shown in the figure. A $p^+$ type source region 14 having an impurity concentration of around $1 \times 10^{19}$ cm$^{-3}$ is deposited on the $p^-$ type layer 13. The $p^{31}$ type regions 11 and 13 have thicknesses of about 32 μm and 7 μm, respectively. The $p^+$ type gate regions have a thickness (channel length) L of about 5 μm, a width (channel width) w and a spacing d of about 3 μm. The total channel width W=Σw is 9.9 cm, and the total chip size is 1.8 mm square.

Characteristics of the above p-channel SIT are shown in FIGS. 1b to 1e.

It will be seen from the characteristic curves of FIGS. 1b and 1c, the drain current $I_d$ substantially follows the exponential formula in the lower current region with respect to both the gate voltage $V_g$ and the drain voltage $V_d$. As the drain current increases, the negative feed-back action due to the series resistance from the source electrode to the pinch-off point becomes apparent, and the exponential formula does not fit well with the data. The dotted lines in FIG. 1c shows the data of pulse measurement for preventing the temperature increase of the element.

FIG. 1d shows the temperature dependency of the drain current vs. drain voltage characteristic of the example of the SIT of FIG. 1a. In this SIT, the channel is not pinched off at zero gate bias, and is pinched off only by the gate bias voltage at gate bias voltages above about 1 V. Therefore, the current vs. voltage characteristic for $V_g=0$ is Ohmic, and has a negative temperature dependency reflecting the temperature dependency of the mobility of charge carriers. When the gate bias voltage exceeds 1 V, the channel is pinched off by the depletion layer due to the gate bias voltage even without the application of any drain voltage. Then, there is established a potential barrier in front of the source, so that carriers should overcome this potential barrier for forming a drain current. This means that the performance of the device is based on the control of majority carrier injection. Thus, the drain current vs. drain voltage characteristic follows the exponential formula, and has a positive temperature dependency in the low drain current region. As the drain current increases, the voltage drop across the series resistance $r_s$ from the source electrode to the pinch-off point increases to act as a negative feedback factor. Then, the potential profile within the current path will form a narrow and deep valley through which carriers propagate. Narrowed current path means an increased series resistance $r_s$ and acts to lower the potential barrier and decrease the drain current increment. Thus, the temperature dependence of the current vs. voltage characteristic becomes negative. FIG. 1d shows the temperature dependency of the drain current vs. drain voltage characteristic in logarithmic scale, and FIG. 1e shows the temperature dependency of the amplification factor $\mu$ in semilogarithmic scale. FIG. 1e shows that the amplification factor $\mu$ is almost constant for the current change from about $10^{-7}$ A to about $10^{-1}$ A, and that it is also almost temperature independent from 195° K to 383° K, i.e. through a temperature range nearly amounting to 200 degrees centigrade. Furthermore, it is apparent that the SIT exhibits an excellent performance in a low-current and low-power-consumption use. The above data show only an example of the performance of the SIT, and the device parameters can be changed widely in accordance with the aimed use.

Figure 2:
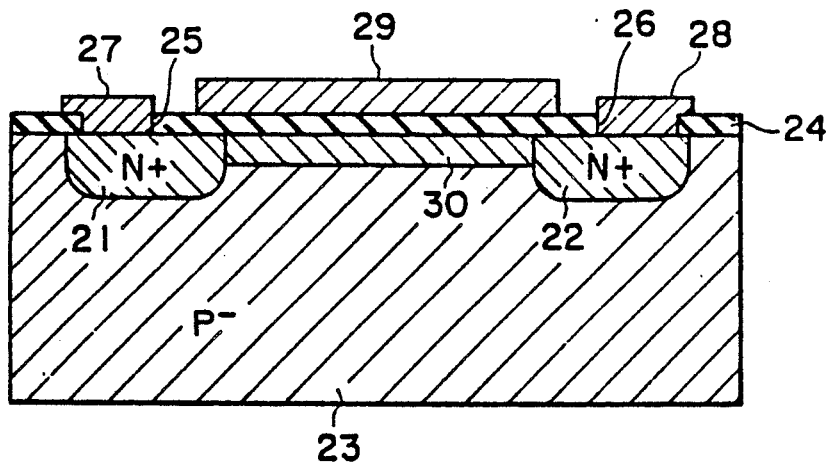
FIG. 2 is a diagrammatic cross-section of a conventional insulated gate field effect transistor (IG-FET).

A conventional enhancement-mode n-channel MOS FET is diagrammatically shown in FIG. 2. In the figure, a source and a drain n+ type region 21 and 22 are formed in a surface of a p-type substrate 23. An oxide layer 24 is formed on the substrate surface except for the window portions 25 and 26 for contacting a source and a drain metal electrode 27 and 28 to the source and drain regions 21 and 22. A gate metal electrode 29 is formed on the oxide film between the source and drain metal electrodes 27 and 28.

As a positive gate bias voltage (including the contact potential) is applied to the gate electrode, an n-type inversion layer 30 appears in a surface portion of the p-type substrate 23 beneath the gate electrode 29 to electrically connect the source and drain regions 21 and 22. Then, a drain current is allowed to flow by the application of a drain voltage. The width of and the carrier concentration in the surface inversion layer depend on the gate bias voltage, the material and thickness of the insulator film between the gate electrode and the substrate, and the material and the carrier concentration in the p-type substrate. Since the thickness of the insulator film 24 and the impurity concentration in the substrate 23 are uniform, the potential distribution between the source and the drain under the application of a drain voltage has only a monotonic change, and never a potential barrier in any operative state. The characteristic of such an IG-FET is of the well-known saturated type.

When a potential barrier is established in the surface inversion layer between the source and the drain and rendered sensitive to the gate and the drain voltage while reducing the series resistance $r_s$ from the source electrode to the pinch-off point, an insulated-gate static induction transistor (IG-SIT) of enhancement mode will be provided.

Figure 3:
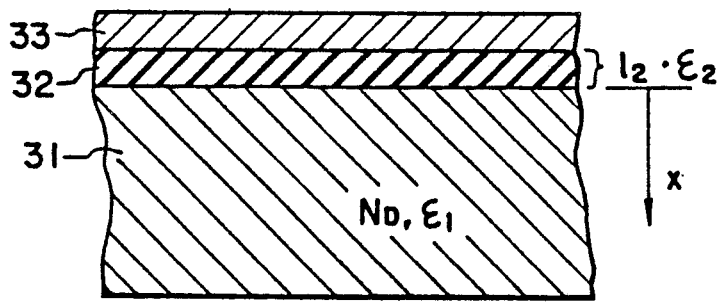
FIG. 3 is a cross-sectional illustration of a metal-insulator-semiconductor (MIS) structure.

A schematic metal-insulator-semiconductor structure is shown in FIG. 3. A semiconductor substrate 31 has an impurity concentration $N_D$ and a dielectric constant $\epsilon_1$. An insulator film 32 having a dielectric constant $\epsilon_2$ is formed on a surface of the substrate 31. The thickness of the insulator film 32 is indicated by $l_2$ while the distance from the surface to the inside of the substrate 31 is indicated by x, as shown in the figure. A metal layer 33 is formed on the insulator film 32. A voltage of such polarity that repels the majority carrier in the semiconductor substrate and attracts carriers of the opposite polarity is referred to as a forward bias voltage. Assuming that a forward bias voltage $V_a$ including the built-in potential (i.e. metal-insulator work function plus insulator-semiconductor work function) is applied between the metal layer 33 and the semiconductor substrate 31, the voltage applied across the insulator film 32 thereby is $V_0$, the electric field inside the insulator film 32 is $E_0$, the electric field and the potential at position x in the semiconductor substrate 31 are $E(x)$ and $V(x)$, and the width of the depletion layer in the semiconductor substrate 31 is W, there hold such relations as $$W = \frac{\epsilon_1}{\epsilon_2} l_2 \left\{ -1 + \sqrt{1 + \left(\frac{\epsilon_2}{\epsilon_1} \cdot \frac{W_a}{l_2}\right)^2} \right\},$$

$$V_0 = \frac{N_D e \epsilon_1 l_2^2}{\epsilon_2^2} \left\{ -1 + \sqrt{1 + \left(\frac{\epsilon_2}{\epsilon_1} \cdot \frac{W_a}{l_2}\right)^2} \right\},$$

$$E_0 = \frac{N_D e \epsilon_1 l_2}{\epsilon_2^2} \left\{ -1 + \sqrt{1 + \left(\frac{\epsilon_2}{\epsilon_1} \cdot \frac{W_a}{l_2}\right)^2} \right\},$$

$$E(x) = \frac{N_D e l_2}{\epsilon_2} \left\{ -1 + \sqrt{1 + \left(\frac{\epsilon_2}{\epsilon_1} \cdot \frac{W_a}{l_2}\right)^2} \right\}(W - x), \text{ and}$$

$$V(x) = \frac{N_D e l_2}{\epsilon_2} \left\{ -1 + \sqrt{1 + \left(\frac{\epsilon_2}{\epsilon_1} \cdot \frac{W_a}{l_2}\right)^2} \right\}\left(\frac{x^2}{2} - \right.$$

$$W_x + \frac{W^2}{2}\Bigg)$$

wherein: $W_a{}^2 = \frac{2\epsilon_1 V_a}{N_D e}$, and $-e$ represents the electronic charge.

When the insulator film is an $SiO_2$ film having a thickness of 500 Å, more than 80% of the bias voltage $V_a$, which is assumed to be greater than 1 V, will be applied to the semiconductor region 31 if the impurity concentration $N_D$ is not larger than $1 \times 10^{15}$ cm$^{-3}$. It will be apparent that as the impurity concentration becomes smaller, the ratio of the voltage applied across the semiconductor region to the total bias voltage will become large, and the influence of the applied voltage will penetrate farther into the semiconductor bulk. The calculated widths of the depletion layer for the cases of $V_a = 1$ V and $N_D = 1 \times 10^{13}$ cm$^{-3}$, $N_D = 1 \times 10^{14}$ cm$^{-3}$ and $N_D = 11 \times 10^{15}$ cm$^{-3}$ are about 10 μm, 3.5 μm and 1 μm, respectively. The field effect from the gate electrode can extend in the depletion layer, but not to the regions which are not depleted. Therefore, for increasing the true transconductance $G_m$, the current path is preferably limited to such a region in which the depletion layer extends.

Thus, a potential barrier can be formed by logically raising the potential $V(x)$. Furthermore, when an n-type region is formed adjacent to a p-type region, there is established a built-in potential therebetween, which can also be used to form a potential barrier. Various embodiments for forming a potential barrier at an intended (intrinsic) gate position by locally raising the potential will first be described hereinbelow in connection with FIGS. 4, 7a to 7d.

Figure 4:
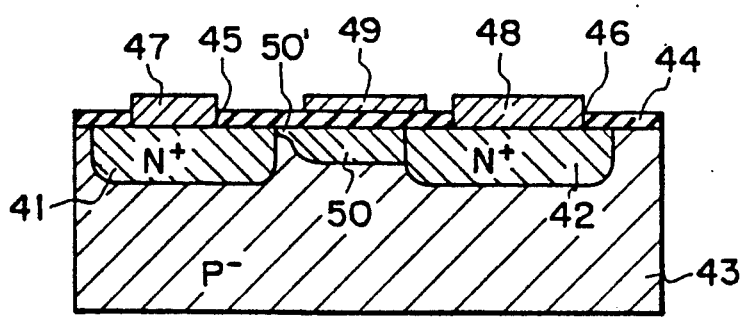
FIG. 4 is a cross-section of an embodiment of an IG-SIT according to the present invention.

FIG. 4 shows an embodiment in which the gate electrode does not overlap the source region. In the figure, a source and a drain n+ type region 41 and 42 are formed in the surface of a p-type substrate 43 and an oxide film 44 and source and drain electrodes 47 and 48 are formed on the substrate surface, similar to the conventional structure of FIG. 2. Here, it is to be noted that the distance from the source 41 to the drain 42 is much reduced. A gate electrode 49 is deposited on the oxide film 44 in a manner that it does not extend to the edge of the source region 41 while it does overlap the drain region 42. Therefore, without the drain voltage application, the equipotential surface in the substrate is almost parallel to the substrate surface beneath the gate electrode 49, but it turns upwardly outside the gate electrode 49. Therefore, the width of the surface inversion layer 50 becomes thinner in the region 50' between the source 41 and the gate electrode 49, as shown in the figure. In other words, the surface potential in the neighborhood 50' of the source region is set lower (higher potential for electrons) than that in the region located beneath the main portion of the gate electrode 49. This means that a potential barrier is established in the region 50' for those electrons flowing from the source to the drain through the surface inversion layer. The barrier height is basically determined by the difference of the Fermi level in the region 50' form that in the source region 41. For effectively varying the Fermi level in the region 50', the impurity concentration in the p-type substrate 43 should be sufficiently low, and the separation between the edge of the gate electrode 49 and the edge of the source region 41 is preferably selected to such value that allows the surface inversion layer 50' extending toward the source region 41 to touch the source region 41 by the application of a forward gate bias voltage of a certain magnitude.

The hatched inversion layer represents the inversion layer in the case wherein no drain voltage is applied. When a positive drain voltage is applied, carriers in the inversion layer on the righthand side of the potential barrier are drawn to the drain region 42 to leave an enlarged depletion layer thereat. Carriers injected from the source over the potential barrier are transported to the drain region 42 by the electric field established by the drain voltage. Furthermore, since the region between the potential barrier and the drain region is short and is easily depleted by the application of a drain voltage, the height of the potential barrier is under the influence of the drain voltage. Thus, if the series resistance between the source region 41 and the potential barrier is sufficiently small, the drain current depends on the gate bias voltage and the drain voltage basically in exponential form.

The amount of electrons injected from the source to the inversion layer on the drain side is proportional to those having higher energies than the barrier height in accordance with the Boltzmann statistics. The position of the potential barrier corresponds to the pinch-off point or the intrinsic gate position. In this embodiment, since the distance from the source region 41 to the pinch-off point is selected sufficiently short, the series resistance $r_s$ from the source electrode 47 to the pinch-off point is small, and the product of the series resistance $r_s$ and the true transconductance $G_m$, that is $r_s \cdot G_m$, is less than one at least in a low drain current region to exhibit unsaturating characteristics. Preferred numerical values for the structure of FIG. 4 are as follows. The impurity concentration of the source and the drain n+ type regions 41 and 42 is of the order of $10^{17}$ to $10^{20}$ cm$^{-3}$, and that of the p-type substrate is of the order of $10^{12}$ to $10^{15}$ cm$^{-3}$. The thickness of the oxide film under the gate electrode is of the order of several ten Angstroms to thousand Angstroms.

Figure 5A:
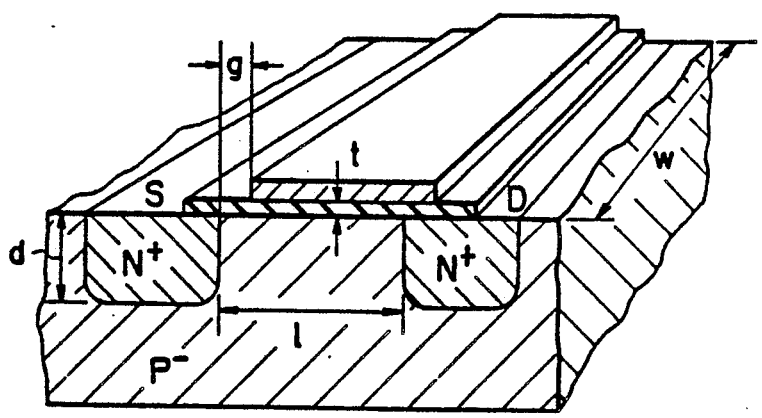
FIGS. 5a and 5b are a cross-sectional perspective view, and a characteristic diagram of an example of the embodiment of FIG. 4, respectively.
Figure 5B:
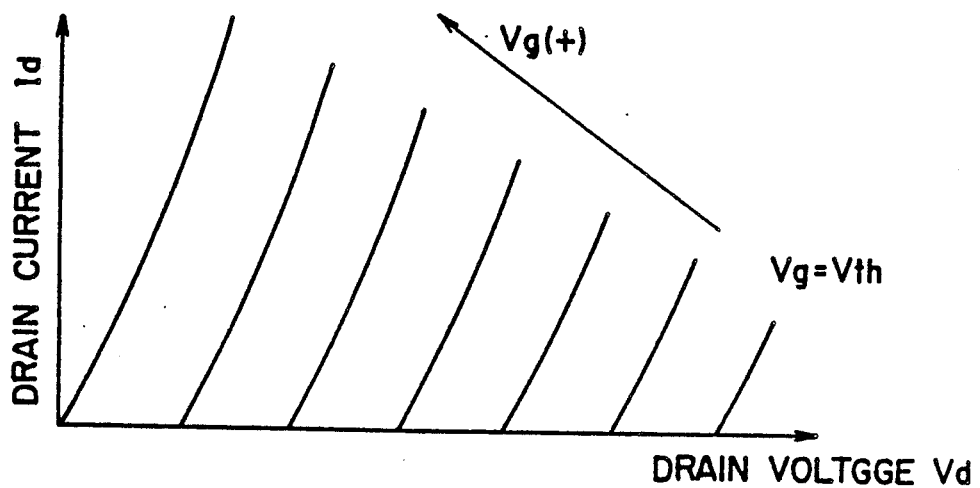

A concrete example of a silicon IG-SIT according to the embodiment of FIG. 4 is shown in FIGS. 5a and 5b. Referring to FIG. 5a, the source and the drain n+ type regions had a depth d of about 1 μm, a width w of about 100 μm and an impurity concentration of about $1 \times 10^{19}$ cm$^{-3}$. The p-type channel region had an impurity concentration of about $1 \times 10^{14}$ cm$^{-3}$ and a length l of about 5 μm between the source and the drain regions. The insulating $SiO_2$ film over the channel region had a thickness t of about 1,000 Å. The gap g between the edges of the source region and the gate electrode was selected to be 0.3 μm.

The characteristic of the example of FIG. 5a is diagrammatically shown in FIG. 5b in which the ordinate and the abscissa represent the drain current and the drain voltage in linear scale. An example of the measured value in the linear region was $I_d$ = several hundred microamperes when $V_g = 0$ V and $V_d = 8$ to 10 V. It was found that the exponential relation could not be realized in some cases wherein surface levels and/or trap levels were considered to be generated in the device.

Figure 6:
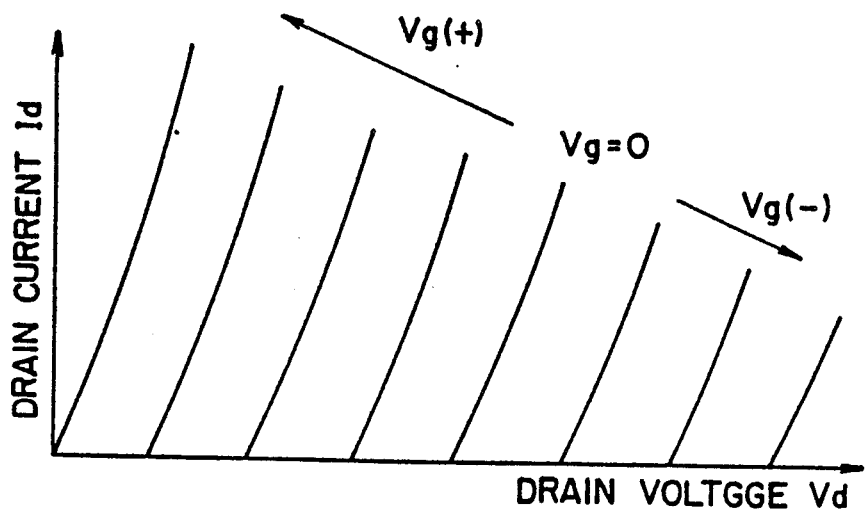
FIG. 6 is a characteristic diagram of an IG-SIT according to a modified embodiment of the present invention, in which an inversion layer is already induced at zero external gate bias.

As is well known, an insulating film containing a predetermined amount of charge of a desired polarity can be formed at will by the current MIS (metal insulator semiconductor) technique. When an insulating film containing such amount of positive charge that can induce an inversion layer without the application of an external gate voltage is used in the structure of FIG. 4, such characteristics as shown in FIG. 6 can be provided. Since a drain current of a certain magnitude is allowed to flow even at zero gate bias, such a device can be used in the depletion mode as well as in the enhancement mode, or in both.

Similar effects to that of charge-containing film can be obtained by reducing the thickness of the insulator film and utilizing the difference in the work function of the gate electrode metal and the semiconductor material. Alternative means for controlling the generation and width of the inversion layer will be apparent form the foregoing and the following descriptions. Namely, the magnitude of the drain voltage at which the drain current builds up under the zero gate bias can be controlled easily by the design of the device structure.

Figure 7A:
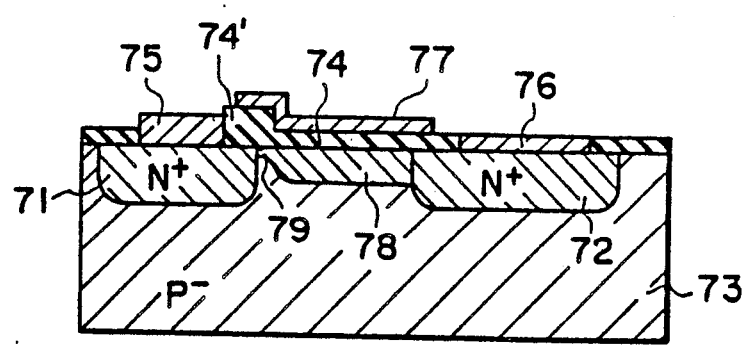
FIGS. 7a and 7d are cross-sections showing alternative embodiments to that shown in FIG. 4.
Figure 7B:
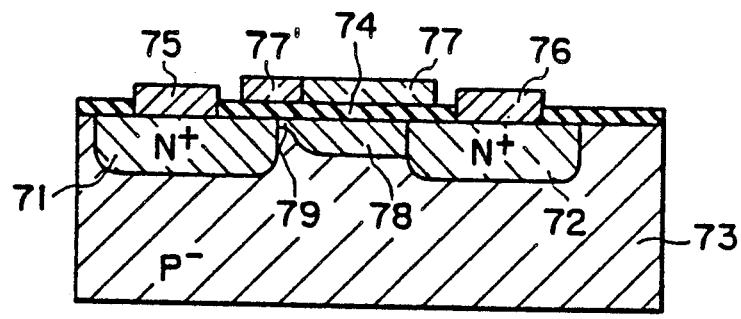
Figure 7C:
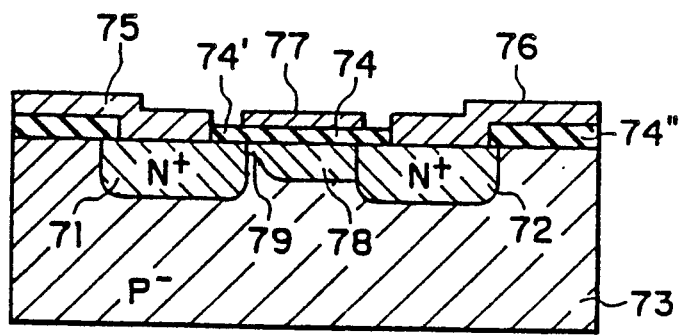
Figure 7D:
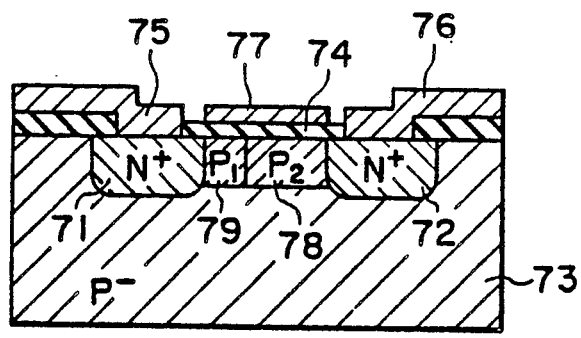
Figure 8A:
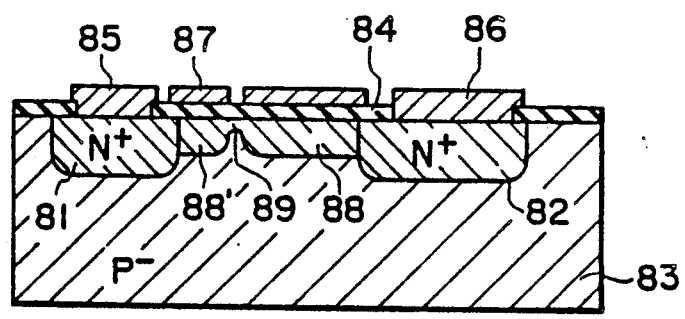
FIGS. 8a to 8e are cross-sections showing modifications of the embodiments shown in FIGS. 4 and 7a to 7d.
Figure 8B:
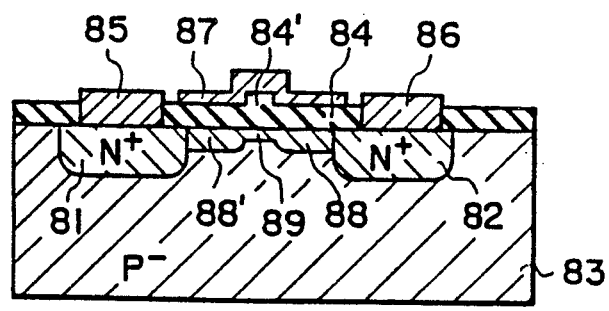
Figure 8C:
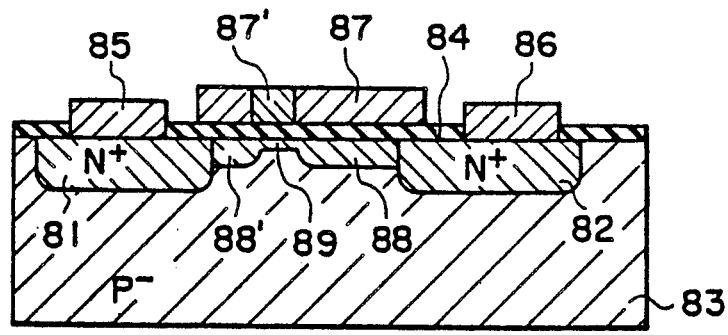
Figure 8D:
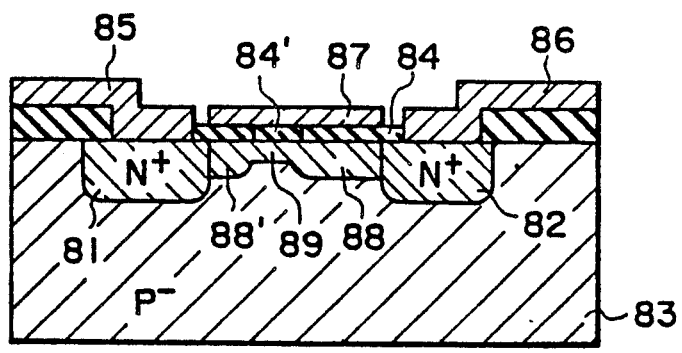
Figure 8E:
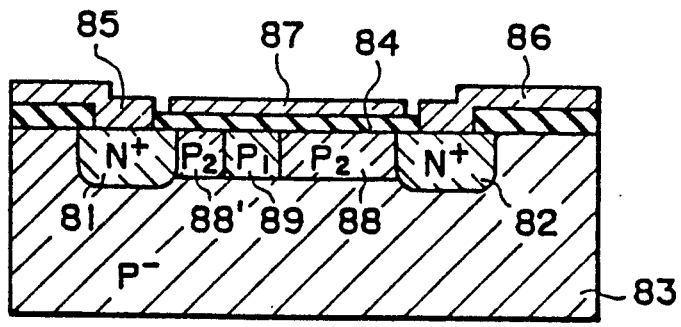

Alternative structure of the insulated gate SIT for establishing a potential barrier in the neighborhood of the source region are shown in FIGS. 7a to 7d. In FIG. 7a, the thickness of an insulating oxide layer 74 under a gate electrode 77 is made thick in the neighborhood of the source region 71 as indicated by numeral 74'. The non-uniformity of the oxide layer produces non-uniformity in the surface potential, and hence a potential barrier for the electrons propagating from the source region 71 to the drain region 72. In FIG. 7b, although the thickness of the oxide layer 74 beneath the gate electrode is substantially uniform, the gate electrode is formed of two sections which are made of metal with different work functions. Namely, the electrode metal 77' in the neighborhood of the source region 71 has a larger work function than that of the electrode metal 77. The unequality relation of the work functions for the two kinds of metal should be reversed for the case of an n-type substrate (p-channel SIT). In FIG. 7c, two kinds of insulator material having dielectric constants $\epsilon_1$ and $\epsilon_2$ are used for two sections of the insulating film 74 and 74'. Namely, when the dielectric constant $\epsilon_1$ of the insulating film 74' in the neighborhood of the source region 71 is selected to be smaller than the dielectric constant $\epsilon_2$ of the insulating film 74 of the other portions, a potential barrier is formed in the neighborhood of the source region 71. When silicon oxide is used as the material of the insulating film 74', the other insulating film 74 may be formed with silicon nitride, aluminium oxide, mixtures thereof, etc. It is known that the dielectric constants of $SiO_2$, $Si_3H_4$ and $Al_2O_3$ are around 3.5 to 4, 6 to 8 and 9 to 10, respectively. In FIG. 7d, non-uniform impurity distribution is formed in the channel to establish a potential barrier. Namely, the impurity concentration of a portion 79 of the channel is locally increased in the neighborhood of the source region.

Any combinations of these techniques are also very effective for establishing a potential barrier of a desired height. Furthermore, although not shown in the figure, embedded heavily doped regions may be formed in the neighborhood of the source region for effectively controlling the potential barrier by the voltage applied thereto.

It will be apparent that the position of the pinch-off point at which the potential barrier is established can be separated away from the source region by modifying the structures of FIG. 4 and FIGS. 7a to 7d. FIGS. 8a to 8e show such modifications in which the non-uniformity of the surface potential is formed at halfway of the channel. When the pinch-off point is separated away from the source region as in FIGS. 8a to 8e, the series resistance $r_s$ increases to some extent. Thus, the building-up of the drain current vs. drain voltage characteristic becomes gentler, and the current at which the current-voltage characteristic departs from an exponential formula shifts to the low current side.

Figure 9A:
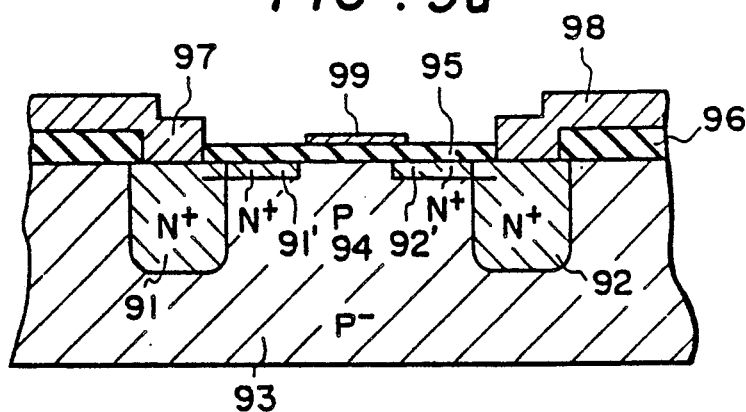
FIGS. 9a to 9c are cross-sections of structural embodiments of the IG-SIT fitted for shortening the channel length.
Figure 9B:
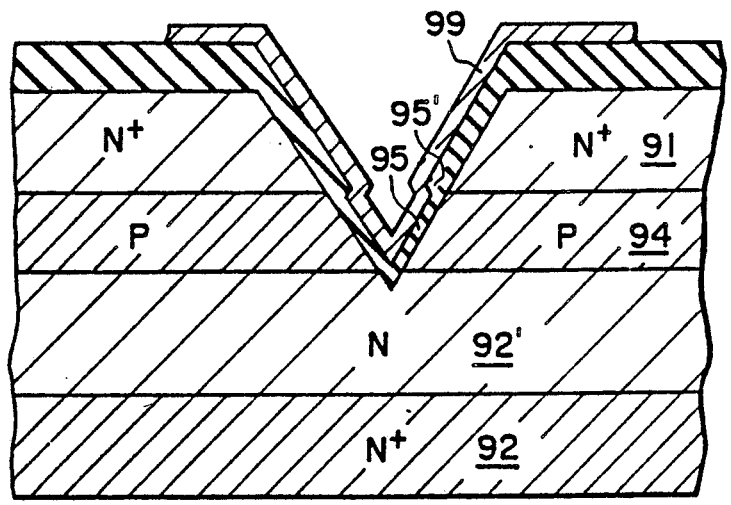
Figure 9C:
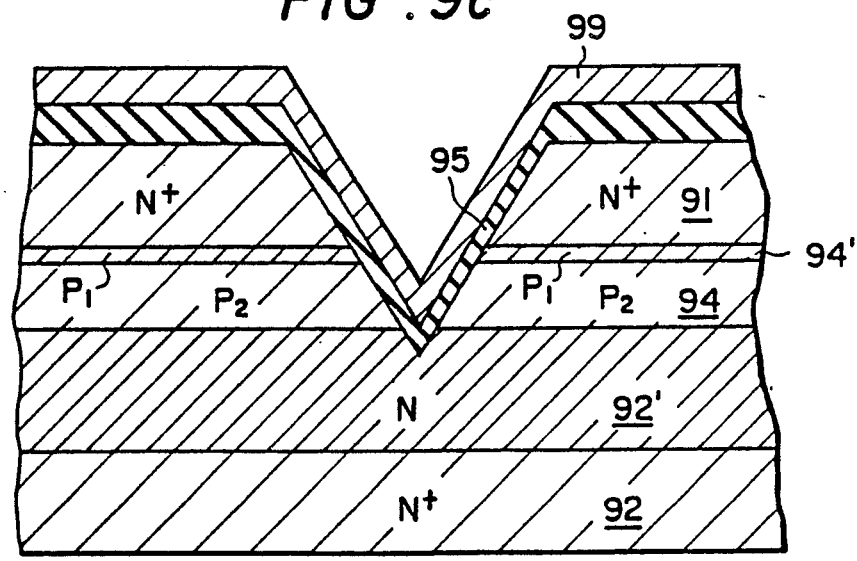

High-speed operation of the SIT can be further enhanced by shortening the channel length. FIGS. 9a to 9c show structures fitted for designing short channel devices.

In FIG. 9a, a source and a drain $n^+$ type region 91 and 92 have extension regions 91' and 92' which limit the length of a p-type channel region 94. The gate structure itself is analogous to that of FIG. 4.

FIGS. 9b and 9c show embodiments of vertical structure. In FIG. 9b, the gate structure is analogous to that of FIG. 7a in the point that the thickness of the insulator film is made thicker in portion 95' than in other portion 95 on the channel region 94. An n-type layer 92' of a low impurity concentration intervenes between the channel layer 94 and a drain $n^{30}$ type layer 92. In FIG. 9c, the non-uniformity of the surface potential is provided by the variation of impurity concentration in the channel region in analogy to the structure of FIG. 7d. Namely, the impurity concentration in the first channel layer 94' is set higher than that of the second channel layer 94.

In an insulated gate SIT, a reduction of the gate capacitance is achieved by decreasing the area of the gate electrode or by increasing the thickness of the insulating layer under the gate electrode. If the insulating layer is made thicker, the gate voltage (threshold voltage) required for forming an inversion layer and for rendering the channel conductive becomes high. This is not desirable from the aspect of device performance. The only alternative way for reducing the gate capacitance is to reduce the size of the gate electrode. In the SIT, the channel length and the gate electrode length are very short compared to those of the conventional FET's. Furthermore, the channel region is formed of a semiconductor region of a low impurity concentration. These features provide a great advantage in high density IC's that the gate capacitance can be greatly reduced.

In the above embodiments, the potential barrier is formed mainly by varying the field effect of the gate voltage. In an enhancement mode IG-SIT, however, there exists naturally a built-in potential between the channel region and the source region which can be utilized for establishing a potential barrier.

Since the field effect of the gate voltage is unable to control such current components that flow through those portions not depleted by this gate voltage applied, the current path or channel should be limited to such region within which the depletion layer can extend from the gate for the purpose of obtaining a large true transconductance $G_m$, i.e. for the purpose of effectively controlling the drain current by the gate voltage.

FIGS. 10a to 10d show embodiments of n-channel SIT with a large true transconductance $G_m$, in which a potential barrier is formed by the use of the built-in potential between the source and the channel region, and the current path is limited in a high resistivity region.

Figure 10A:
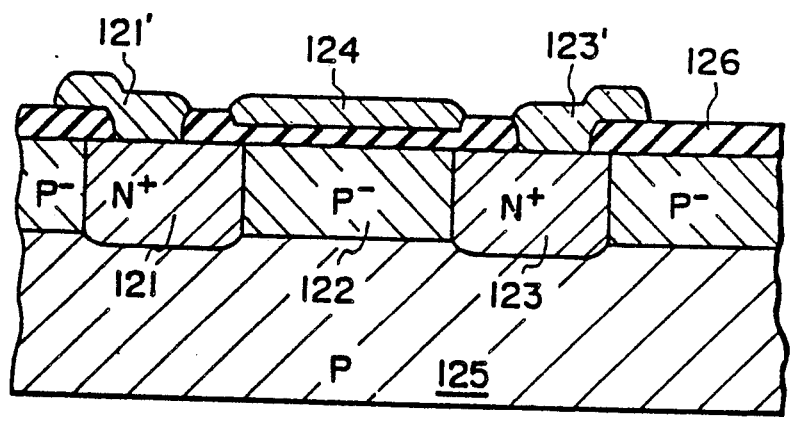
FIGS. 10a to 10d are cross-sections of further embodiments of the IG-SIT according to the present invention, in which the built-in potential between the source region and the channel-forming semiconductor region is utilized for establishing a potential barrier.
Figure 10B:
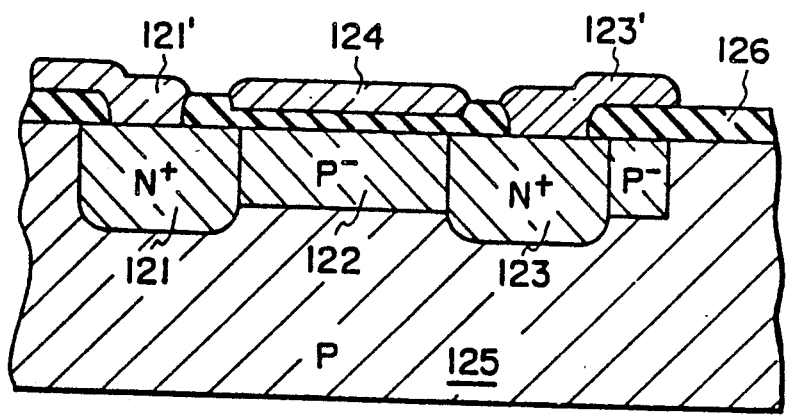
Figure 10C:
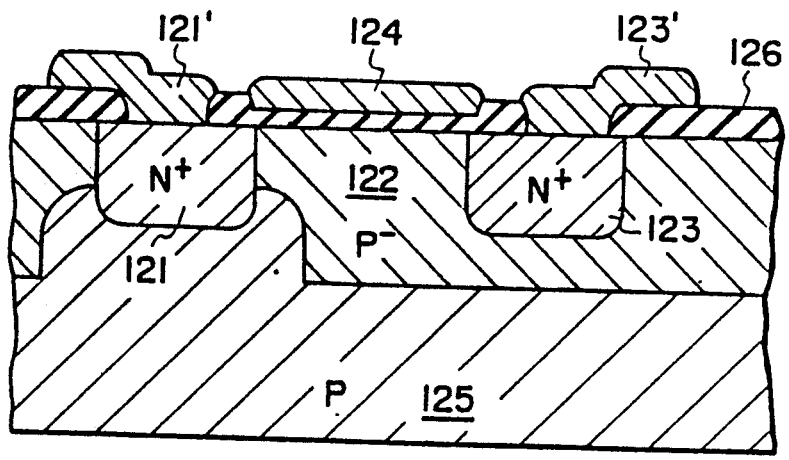
Figure 10D:
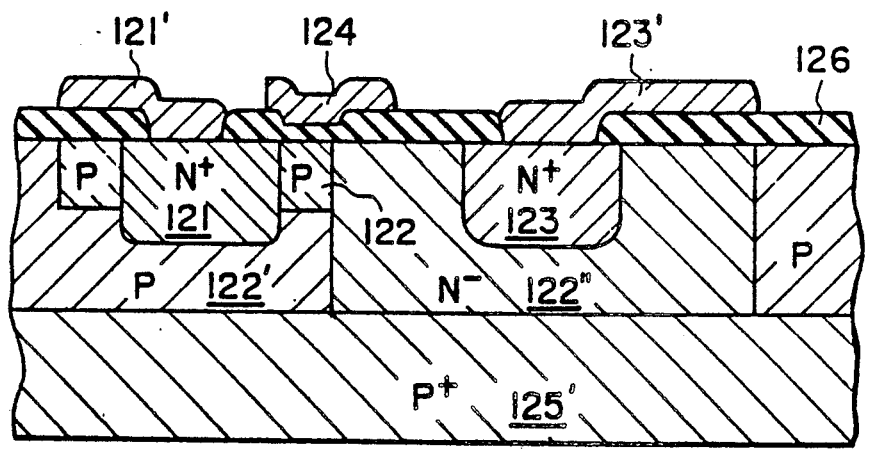

Through FIGS. 10a to 10c, highly doped $n^{30}$ type source and drain regions 121 and 123 are formed in a p-type substrate 125 to a certain depth and a high resistivity p⁻ type channel region 122 is formed between the source and drain regions 121 and 123 to a shallower depth. A source electrode 121' and a drain electrode 123' are formed on the source region 121 and the drain region 123, and a gate electrode 124 is formed on the channel region 122 through an insulating film 126. An n+p junction or an n+p⁻ junction is formed between the source 121 and the channel region 122. In FIG. 10d, a p-type region 122' has a higher impurity concentration than that of the p-type channel region 122, and an n⁻ type region 122" surrounds the drain region 123. Typical value of the impurity concentration in the n+ type regions 121 and 123 is about $10^{17}$ to $10^{21}$ cm⁻³, that of p⁻ type region 122 being about $10^{13}$ to $10^{16}$ cm⁻³, that of p-type region 122' being about $10^{14}$ to $10^{18}$ cm⁻³, that of n⁻ type region 122" being about $10^{12}$ to $10^{15}$ cm⁻³, that of p-type substrate 125 being about $10^{15}$ to $10^{18}$ cm⁻³ and that of p+ type substrate 125' being about $10^{17}$ to $10^{20}$ cm⁻³. The insulating film formed under the gate electrode 124 is thin to ahve a thickness in the range of about 100Å to about several thousand Angstroms for the purpose to desirably control the voltage drop across the insulating film and of achieving the required insulation.

In these embodiments, the length and the impurity concentration of the channel region are so selected to insure that the application of a certain drain voltage will easily grow a depletion layer around the channel-drain pn junction and that this depletion layer will extend toward the source region and will control the potential barrier generated by the source-channel n+p junction in the neighborhood of the source region. The height of this potential barrier is more dominantly controlled by the gate voltage.

When a drain voltage is applied, the height of the potential barrier is reduced, and the amount of electrons (in case of n-channel SIT) injected from the source to the drain over the potential barrier increases substantially exponentially with respect to the barrier height, and hence with respect to the applied drain voltage and also to the gate voltage, at least in a low drain current region. When the drain current increases, the negative feedback action by the series resistance from the source electrode to the potential barrier becomes intensive, and the current vs. voltage characteristic deviates from the exponential formula. In the embodiments of FIGS. 10a to 10d, when the forward gate bias is increased further to such an extent as to induce a sufficient surface inversion layer, Ohmic current component also arises.

More particularly, FIG. 10a shows a simple structure in which source and drain $n^{30}$ type regions are formed in and penetrate through a p⁻ type region. When the integration density is raised and the distance between the adjacent source and drain is reduced, there arises the possibility of punch-through between adjacent regions, and hence it is preferable to adopt such structures as shown in FIG. 10b for preventing the punch-through current. In FIG. 10b, the respective elements are separated from each other and the p⁻ type channel region 123 also surrounds the drain region 123. The p⁻ type region around the drain serves to reduce the drain capacitance. Usually, the substrate is held at the same potential as that of the source. Then, charge carriers (electrons) flow limitedly in the neighborhood of the surface of the channel region 122 located away from the substrate 125 in the structures of FIGS. 10a and 10b. This means that the mobility of carriers is smaller than the intrinsic mobility due to the surface levels, and the resistance tends to become large. The mobility of charge carriers will become intensified, and the resistance will be reduced if the injected charge carriers move away form the surface and in a wider cross-section. The structure of FIG. 10c takes these points into consideration. Namely, the p⁻ type channel region 122 has a cross-section diverging progressively toward the drain. According to this structure, not only the resistance is reduced, but also the drain capacitance is decreased by the encapsulation of the drain region 123 by the p⁻ type region 122, thereby further enhancing the high-speed operation of the device. Such effects are more remarkably pronounced in the structure of FIG. 10d. In this structure, the n+ type drain region 123 is surrounded by the highly resistive n⁻ type region 122". The drain capacitance is reduced thereby, and the electrons injected from the source will spread widely and deeply from the surface since no electrode is provided on this n⁻ type region. The p-type region 122 constituting the channel is provided only in the neighborhood of the source, and this region can have a higher impurity concentration as compared to that of the structures of FIGS. 10a to 10c. When a voltage is applied to the drain electrode, a depletion layer grows from the channel-drain pn⁻ junction into the p-type region 122 to extend to the neighborhood of the source. This structure has such advantages that the drain resistance is small, easily allowing a drain current to flow, and that the gate and drain capacitances are small. Whereby, this structure is extremely suitable for a high-speed operation.

Figure 11A:
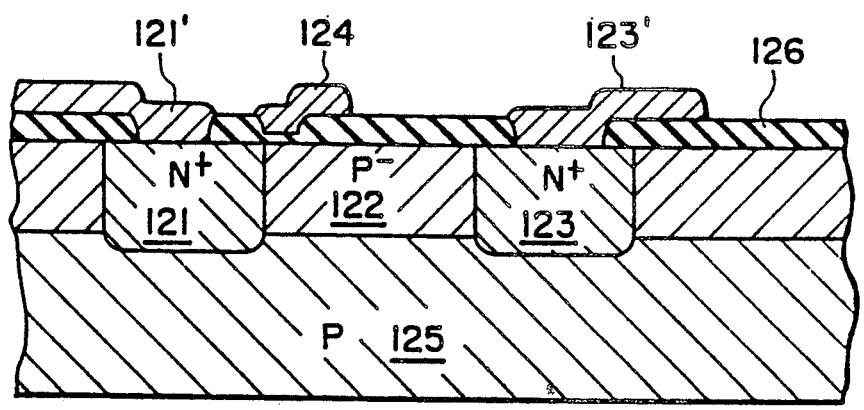
FIGS. 11a to 11c are cross-sections of IG-SIT according to further embodiments of the present invention.
Figure 11B:
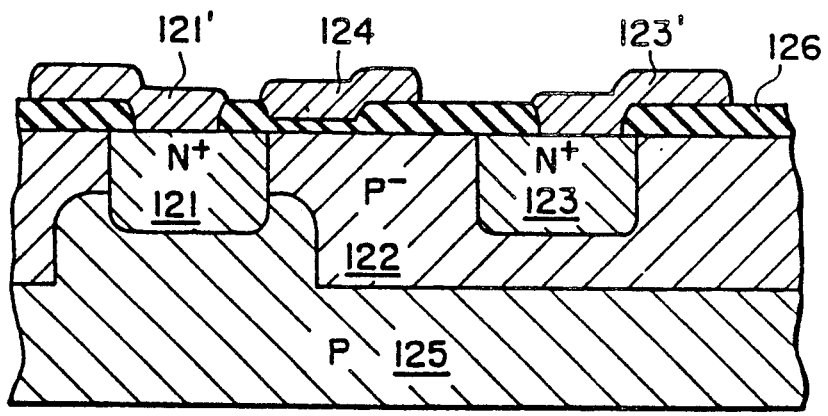
Figure 11C:
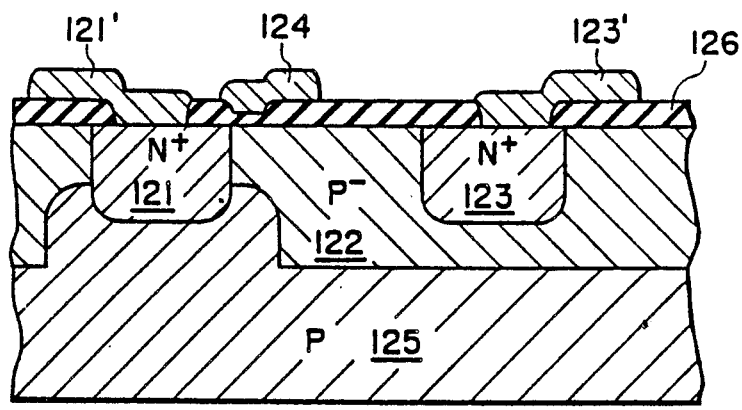

FIGS. 11a to 11c show structures adapted for transporting injected carriers in a wide portion extending deep from the surface. In these structures, the gate electrode is provided only in the neighborhood of the source region 12 so as to prevent the lowering of the surface potential in the whole channel portion by the gate bias, and to allow the passage of charge carriers only in the surface portion of lowered potential near the source region. Charge carriers spread widely into the crystal and travel toward the drain. This effect is more pronounced in the structures of FIGS. 11b and 11c. If punch-through becomes a problem, it can be solved by arranging so that the respective elements are separated from each other as shown in FIG. 10b.

Throughout the embodiments of the present invention, it should be noted that, under the application of a gate bias voltage, an injection of charge carriers occurs most prominently in the surface portion. However, since the channel region is formed with a relatively highly resistive region, the effective channel width becomes wide due to the space charge effect of the injected carriers, and hence carriers are effectively injected in a wide cross-section.

The existence of a depleted high resistivity region between the intrinsic gate and the drain allows the carriers to drift toward the drain. The channel region should have such dimensions and such impurity concentration (distribution) that will cause the drain and gate bias voltages to effectively control the barrier height (drain current). The gate capacitance and the drain-substrate capacitance can be sufficiently minimized, and the drain current builds up sufficiently at small drain voltages to provide a large transconductance. Thereby, a very low power and high speed operation is feasible. Together with the relatively simple manufacture, the above-mentioned embodiments are quite fitted for use in integrated circuits.

It will be apparent to those skilled in the art that the above-mentioned embodiment can be altered or modified in various ways. For example, any combinations of the embodiment are possible, the conductivity types may be reversed, and the shapes and dimensions of the respective regions may be appropriately changed.

Now, embodiments of integrated circuit utilizing the above-described insulated-gate SIT will be described.

Figure 12A:
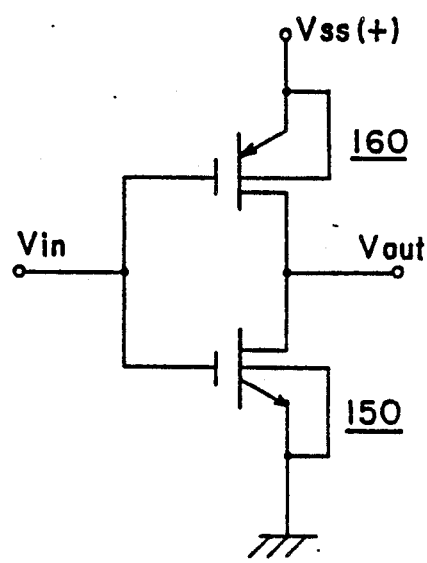
FIGS. 12a to 12b are a circuit diagram and a crosssection showing a complementary IG-SIT inverter according to another embodiment of the present invention.
Figure 13A:
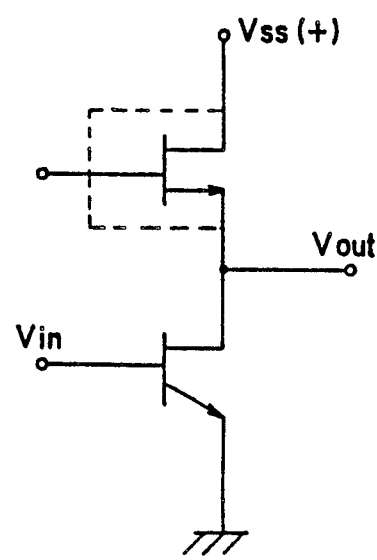
FIGS. 13a to 13d are a circuit diagram of an inverter utilizing an IG-SIT and an IG-FET and cross-sections showing various structures of an inverter utilizing an IG-SIT and an IG-FET.
Figure 12B:
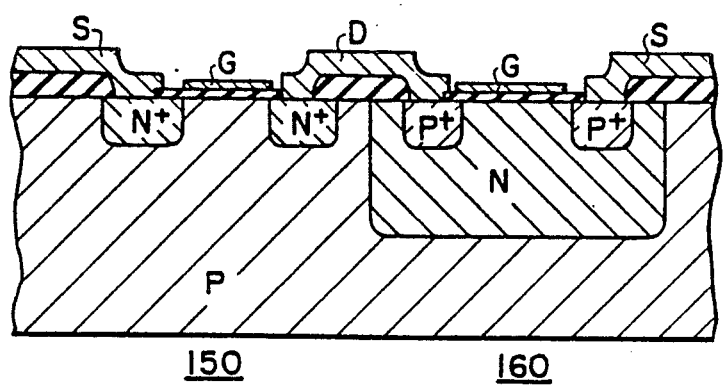

FIGS. 12a and 12b show the circuit diagram and a structure of a complementary IG-SIT inverter. An n-channel SIT 150 and a p-channel SIT 160 are formed in a p-type substrate. The gate electrodes of the two SIT's are connected together by a metal wiring (not shown).

Figure 13B:
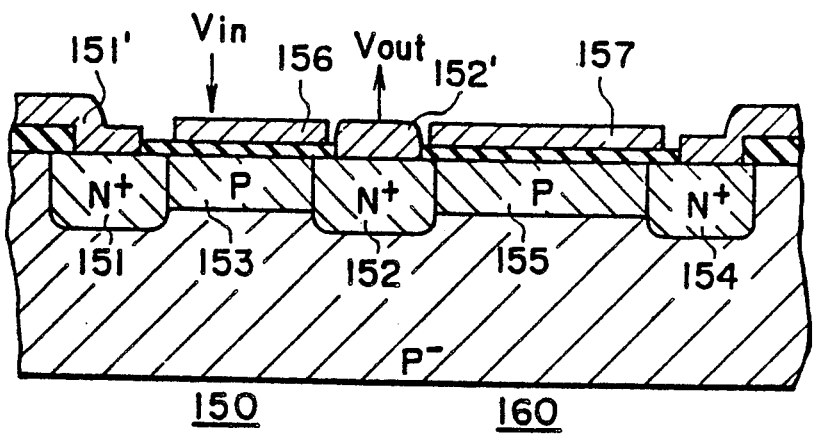
Figure 13C:
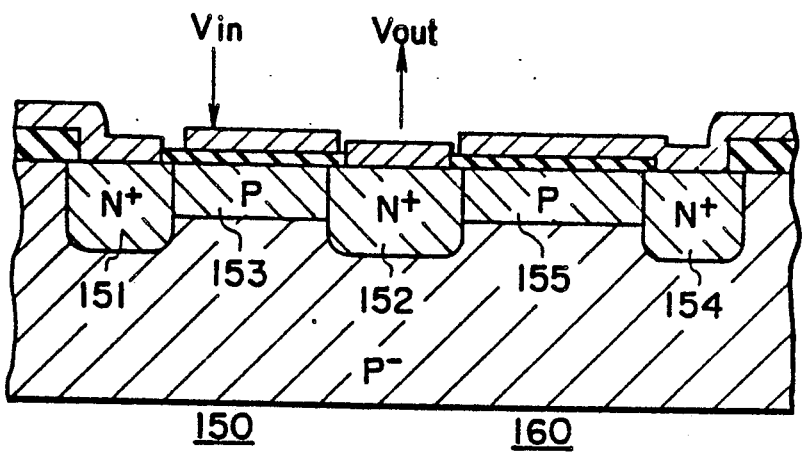
Figure 13D:
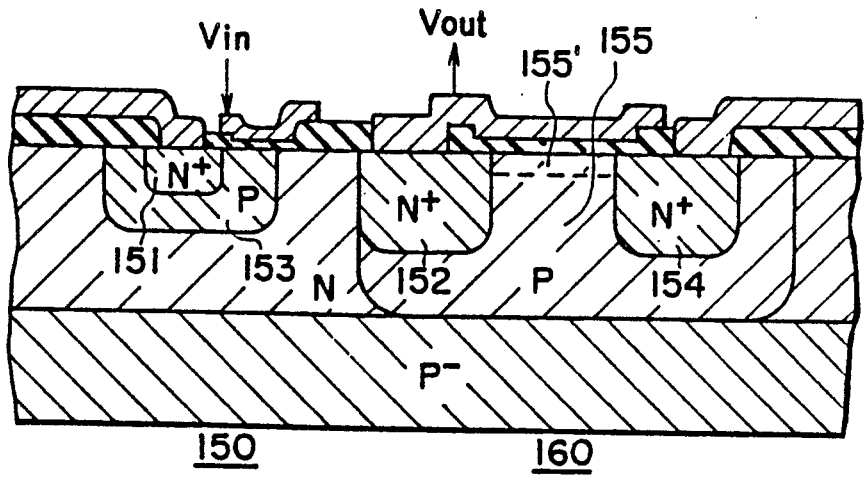

FIG. 13a, 13b, 13c and 13d show a circuit diagram, and also example structures of SIT inverter having a load formed with an unsaturating IG-FET, a saturated IG-FET and a depletion mode FET. An $n^+$ type region 152 located at the center serves as the source of the righthand FET as well as the drain of the lefthand SIT. An input signal is supplied between the gate 156 and the source 151' of the SIT, and the output is derived from the drain 152' of the SIT 150 (source of the FET 160). In FIG. 13b, the gate bias voltage for the FET 160 is given independently, while in FIG. 13c it si at the same potential with that of the drain. In FIG. 13d, the p-type channel region 153 is formed around the $n^+$ type source region in the SIT 150 to facilitate the shortening of the channel. The gate of the load FET is set at the same potential as at the source.

Figure 14A:
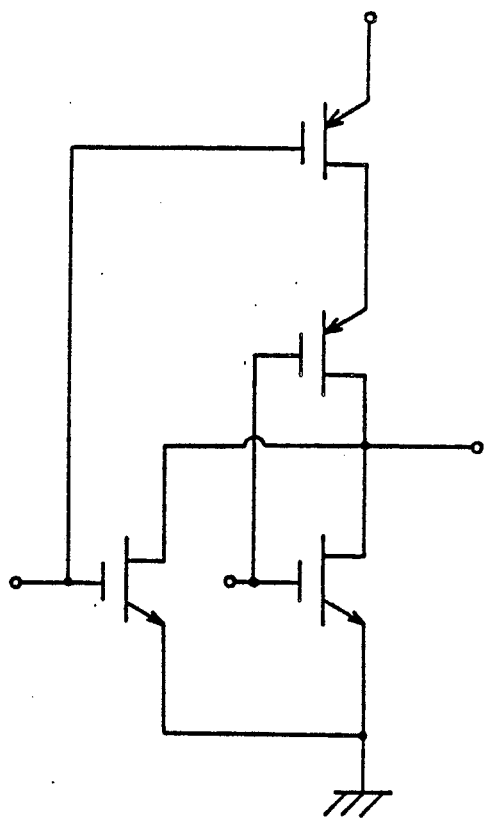
FIGS. 14a and 14b are circuit diagrams of gate circuits utilizing IG-SIT according to the present invention.
Figure 14B:
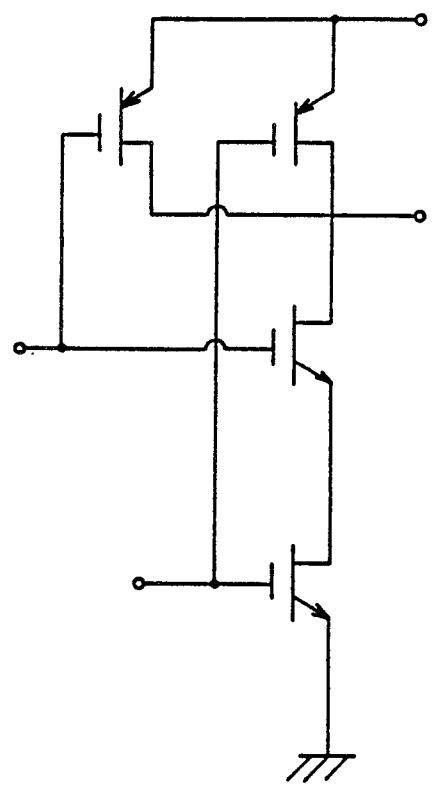

As an example of the gate circuit, an NOR gate and a NAND gate, both being of the 2-input type, are shown in FIGS. 14a and 14b. Each one of these circuits can be formed with two n-channel IG-SIT's and two p-channel IG-SIT's. It will be apparent that gate circuits with more than two inputs and any kinds of logic circuits can be formed by increasing the number of the IG-SIT's employed.

Figure 15A:
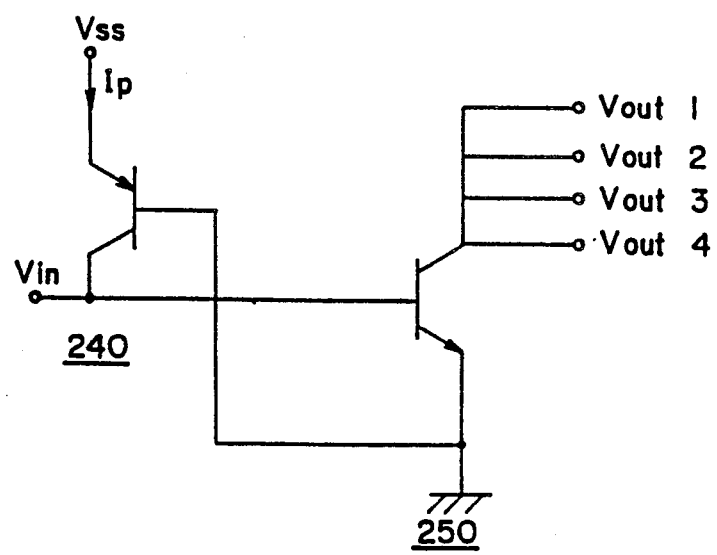
FIGS. 15a and 15b are a circuit diagram and a cross-section of a conventional 1-input, 4-output IIL circuit utilizing bipolar transistors.
Figure 15B:
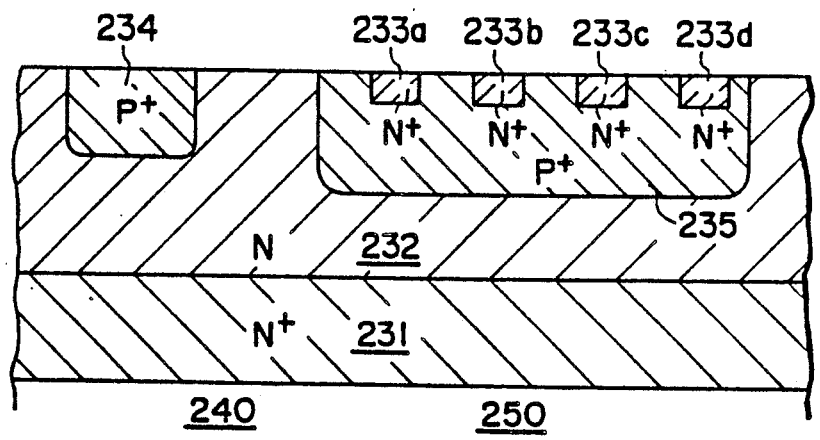

FIGS. 15a and 15b show the conventional injection integrated logic (IIL) circuit of 1-input, 4-output configuration utilizing bipolar transistors. Referring to the circuit diagram of FIG. 15a, an injector transistor 240 operates as a constant current source, and injects a current into the base of an inverter transistor 250 when the preceding stage ($V_{in}$) is cut off. When the preceding stage is conductive, the carriers are drawn to the ground through the preceding stage. Four outputs $V_{out1}$ to $V_{out4}$ form the inputs of the following stage. Symbols $V_{ss}$ and $I_p$ represent the source voltage and the injected current respectively. In FIG. 15b, a lateral bipolar transistor 240 which is formed with a $p^+$ type region 234, an n-type region 232 and a $p^+$ type region 235 serves as an injector (load) transistor, and an inversely operated bipolar transistor 250 which is formed with an $n^+$ type region 231, the n-type region 232, the $p^+$ type region 235 and $n^+$ type regions 233a to 233d serves as an inverter (driver) transistor. The respective regions 234, 232 and 235 form the emitter, the base and the collector, respectively, of the lateral bipolar transistor 240, and the regions 231, 235 and 233a to 233d from the emitter, base and collectors, respectively, of the inversely operated bipolar transistor.

Figure 15C:
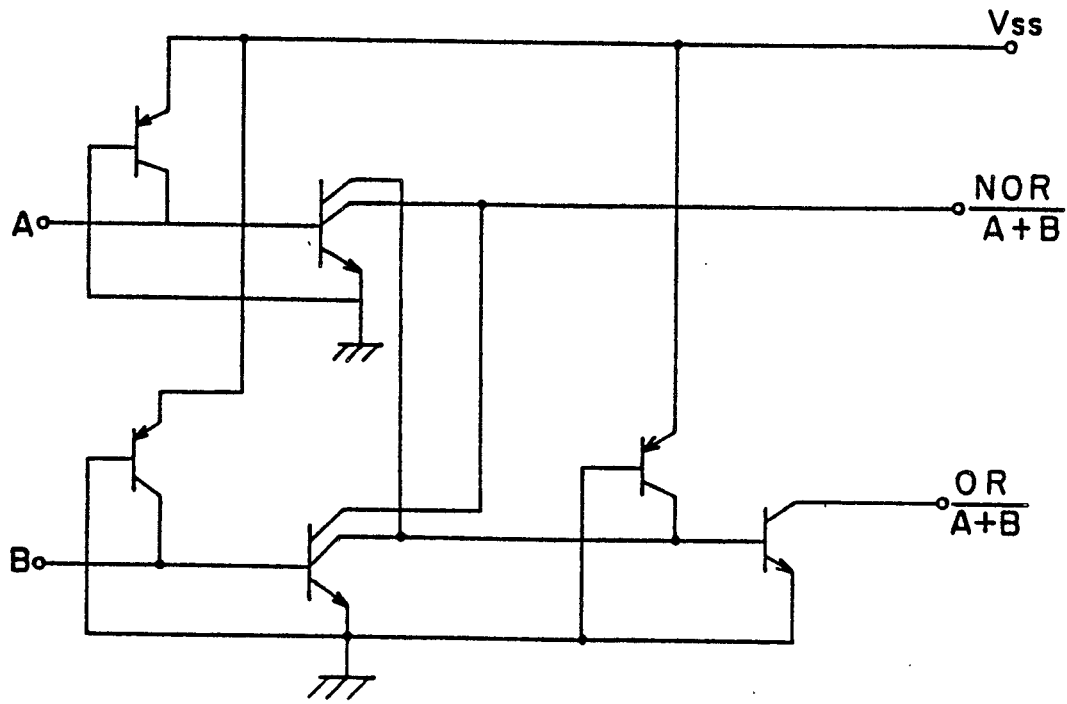
FIG. 15c is a circuit diagram of a logic circuit utilizing three IIL circuits.

In an IIL, there is no need of insulating the collectors of the inversely operated output transistor, as can be seen in FIG. 15b. Thus, the manufacture becomes easy, the integration density increases much and the power dissipation is very low. When there is no input signal (or when the inverter or driver transistor of the preceding stage is conductive), the base potential of the inverter transistor 250 of this stage is held, for example, at about 0.1 V, hence the inverter transistor 250 is cut off, and the output terminals $V_{out1}$ to $V_{out4}$ are held at a high voltage, for example, at about 0.6 to 1 V. When there is an input signal $V_{in}$ (or when the inverter transistor of the preceding stage is switched from the conductive state to the cut-off state), the base potential of the inverter transistor becomes high to change the outputs $V_{out1}$ to $V_{out4}$ to a lower voltage. Namely, the IIL circuit operates as an inverter. When the inverter transistor is cut off, the current $I_P$ supplied from the injector flows through the inverter transistor of the preceding stage. When the inverter transistor becomes conductive, the current $I_D$ flows through the base-emitter of this inverter transistor. All kinds of logic operations can be provided by combinations of the units shown in FIGS. 15a and 15b, each operating as an inverter. FIG. 15c shows that each of 2-input NOR and OR circuits can be formed by two 1-input, 2-output IIL units and a 1-input, 1-output IIL unit.

It was proposed in Japanese Patent Application No. 50-146588 that when the inverter bipolar transistor of the conventional IIL is replaced by an inversely operated SIT, the features of low-power dissipation and high-speed operation can be enhanced further. Since the channel region of an SIT is formed with a high resistivity region, capacitances between the respective electrodes become small as compared to the bipolar transistor. Furthermore, when a bipolar transistor is used as the injector, it will be noted that since the minority carriers which may be injected form the gate of the inversely operated SIT which is used as the inverter transistor are transported mainly by drift (not diffusion) in contrast to the case of a bipolar transistor inverter, the storage effect of the carriers is extremely small. Thus, the IIL circuit utilizing an SIT exhibits excellent performance with a very low-power dissipation and high-speed operation. When the injector transistor as well as the inverter transistor of an IIL are each formed also with SIT's, the power dissipation of the IIL can be suppressed to being almost negligible, since almost no current is required for driving the inverter SIT.

Figure 16A:
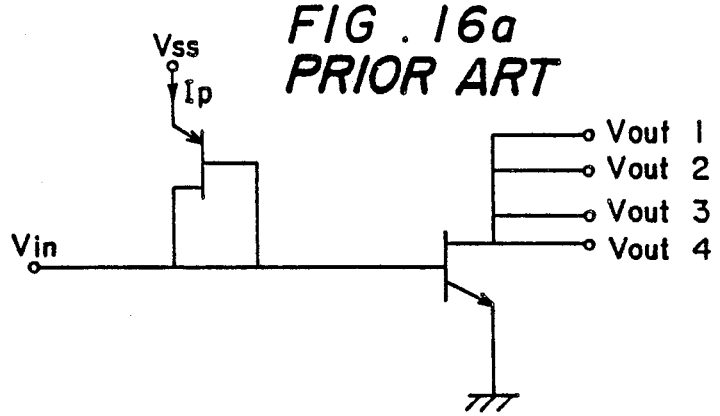
Figure 16B:
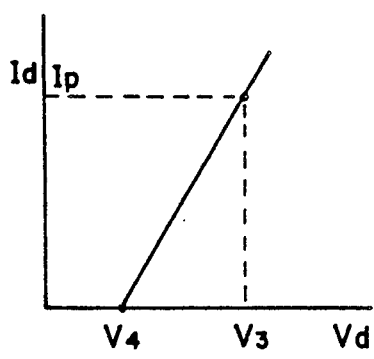
Figure 16C:
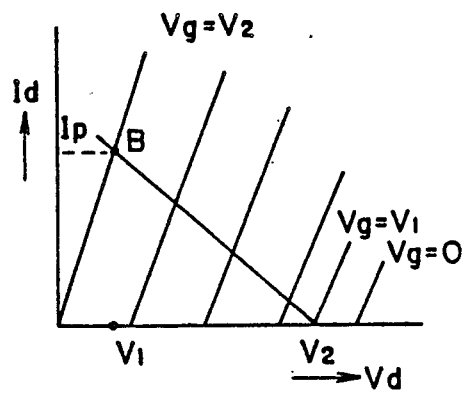
Figure 16D:
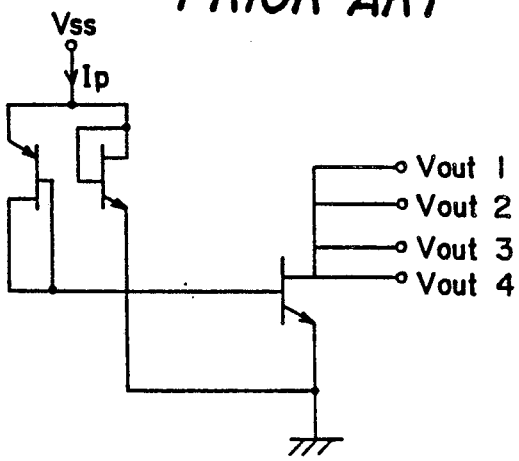
Figure 16E:
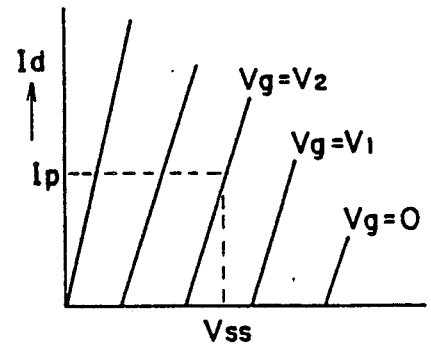

FIGS. 16a, 16b and 16c show a circuit diagram and characteristic charts for explaining the operation of an IIL comprising an injector SIT and an inverter SIT. FIGS. 16b and 16c show the characteristics of the injector and driver SIT's. When there is no input signal (or when the inverter transistor of the preceding stage is conductive), the input terminal $V_{in}$ is at a low level $V_1$. When the inverter transistor of the preceding stage is cut off, the input terminal $V_{in}$ is at a high level $V_2$. The value of $V_2$ is selected to be such value, for example, around 0.4 to 0.5 V, at which almost no current is injected from the gate into the channel of the inverter transistor. When the inverter transistor is cut off, a current $I_D$ corresponding to a source-drain voltage $V_3 = V_{ss} - V_1$ flows through the injector SIT. When the inverter SIT is conductive, the source-drain voltage of the injector SIT becomes $V_4 = V_{ss} - V_2$ to allow almost no current to flow through the injector. Thus, in the IIL circuit comprising an injector SIT and an inverter SIT, almost no current can be supplied to the gate of the inverter SIT to cause almost no storage effect of minority carriers, while the injector SIT can be cut off when of the preceding stage is turned off and the inverter SIT of the present stage becomes turned on. Thereby, inverters of extremely low-power consumption can be provided. Furthermore, if it is desired to eliminate the change in the current flowing through the supply line due to the change in the current flowing through the injector, another SIT may be provided as in FIG. 16d. The desired characteristic of this additional SIT is shown in FIG. 16e.

When the highest speed operation is desired in an IIL, it is preferable to operate the injector transistor of any type as a current source and also to form the inverter with an SIT. When the inverter is a J-SIT, a small amount of minority carrier injection into the channel from the gate will also enhance the operation speed probably due to the enhanced injection of majority carriers from the source to the channel by the attraction of these minority carriers without causing the storage effect of minority carriers (diffusion length being far longer than the channel length).

Now, IIL circuits comprising an IG-SIT used as the inverter SIT according to the embodiments of the present invention will be described by referring to FIGS. 17a to 17d. The inverter transistor is formed with an inversely operated (or upside-down) J-SIT. Although only one inverter SIT is shown in each figure, the number of the inverter SIT's can be increased arbitrarily as required. In contrast to the current-controlled bipolar transistor, the SIT is a voltage-controlled transistor which can be controlled on and off by the (gate bias) voltage. Thus, it is easy to increase the number of the outputs, i.e. the fan-out.

A p-channel IG-SIT is formed of a p+ type region 274, an insulated gate structure 276, an n-type region 272 (which forms a p-type channel) and a p+ type region 275. The source and drain p+ regions 274 and 275 have an impurity concentration of around $10^{17}$ to $10^{21}$ cm$^{-3}$, and the n-type region 272 has an impurity concentration around $10^{12}$ to $10^{17}$ cm$^{-3}$ and is determiend in connection with the inverter J-SIT 261. The inverter SIT 261 is formed with an n+ type 271 forming the source, the n-type region 272 forming the channel, the p+ type region 275 forming the gate and an n+ type region 273 forming the drain. The source and drain n+ type regions 271 and 273 have impurity concentrations around $10^{17}$ to $10^{21}$ cm$^{-3}$. The impurity concentration of the n-type channel region 272 is preferably so selected, in connection with the channel width, to provide so as to be operative that the output SIT 261 is cut off at zero gate bias and becomes conductive by the application of a forward gate bias voltage around 0.4 to 0.5 V. Namely, at zero gate bias, depletion layers extending from the gate region will pinch off the channel and will form a sufficient potential barrier in front of the source region 271. When a forward gate bias is applied, the potential barrier is lowered to allow some amount of charge carriers to go over the barrier. When the impurity concentration of the channel is to be varied in designing a desired performance, it may be changed only partially as shown at 272' below the gate 276 in FIGS. 17b and 17d.

When the impurity concentration $n_1$ of the region 272' is selected to be lower than that of the n-type region 272, the inversion and depletion layers grow easily in the region 272' but are substantially stopped at the interface with the region 272. On the other hand, when the impurity concentration $n_1$ is selected to be higher than that of the region 272, it is effective for preventing punch-through. Here, the injector transistor may have a punch-through current to achieve the similar performance.

Figure 17A:
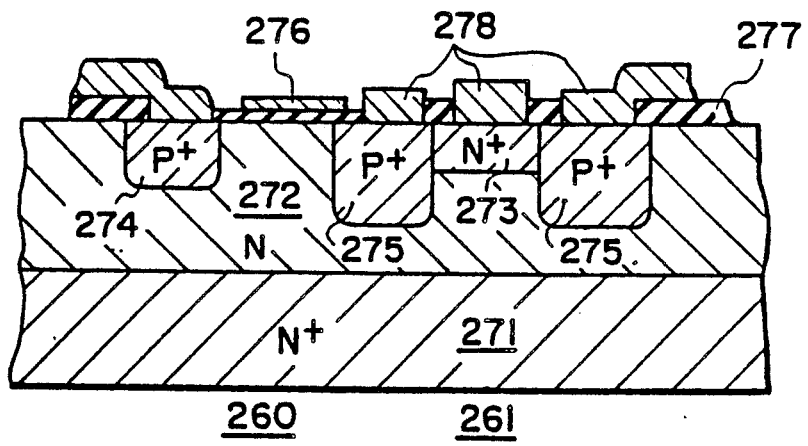
FIGS. 17a to 17d and FIGS. 18a to 18d are cross-sections of IIL structures according to further embodiments of the present invention.
Figure 17B:
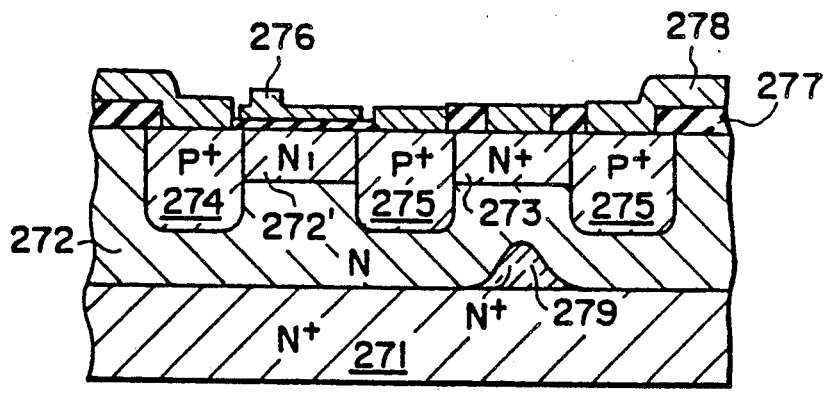
Figure 17C:
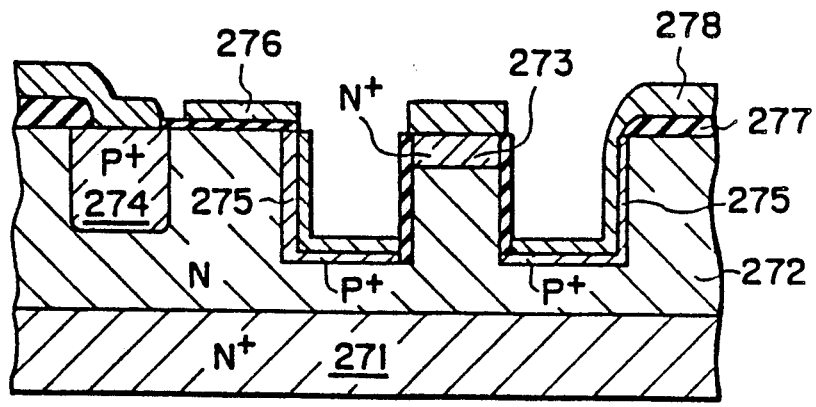
Figure 17D:
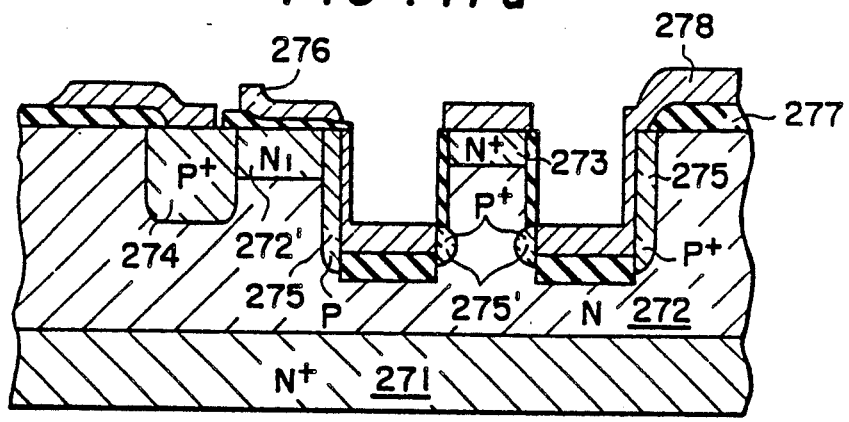

In FIGS. 17a and 17b, the gate reigon 275 of the inversely operated SIT is formed by diffusion or ion implantation from the surface, while in FIGS. 17c and 17d it has a cutaway structure so as to reduce the gate capacitance, thereby enhancing the operation speed and reducing the power dissipation. In FIG. 17c, the gate region 275 has a vertical portion and a horizontal portion, and such structure is not desirable from the view point of lowering the parasitic gate capacitance. In FIG. 17d, the horizontal portion of the gate region 275 is eliminated except for the semi-cylindrical protrusions 275'. The regions 275 and 275' are connected together through metal electrodes. Thus, the parasitic gate capacitance is reduced to further enhance high-speed operation. In FIG. 17c, an n+ type protruding region 279 is provided on the source region 271 to eliminate (or reduce) the neutral region between the n+ type source region 271 and the depletion layers extending from the gates 275. This protrusion is effective for lowering the series resistance $r_s$ and for reducing the carrier transit time from the source to the drain region almost without increasing the source-gate capacitance of the inversely operated J-SIT 261. Therefore, this structure is very useful for high-speed or high-frequency use. It will be apparent that such protrusion of a highly doped region can be provided in any embodiments of the present invention. The insulated gate structure of the injector IG-SIT 260 is shown to have a gap between the source region and the gate electrode (FIGS. 17a and 17c), or an insulator film with an increased thickness in the neighborhood of the source region (FIGS. 17b and 17b). It will be apparent that the potential barrier of the IG-SIT may be established in accordance with any desired one of the means disclosed. The distance between the source region 271 and the drain region 273 in the J-SIT 261 may be so selected that the carrier transit time between the source 271 and the drain 273 does not limit the highest operation speed. The inverter (driver) transistor 261 is not limited to the J-SIT, but it may be formed with any transistor, e.g. IG-SIT, Schottky type SIT, and the like. Also, the inverter transistor may be formed by an IG-SIT, whereas the load transistor may be of any type.

FIGS. 18a to 18d show IIL circuit structures using an IG-SIT of V-cut shape as the inverter SIT.

Figure 18A:
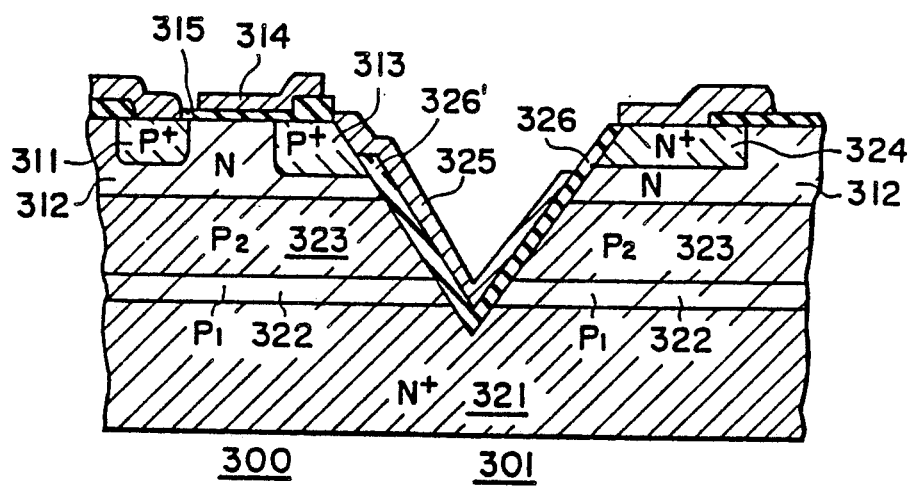

In FIG. 18a, an IIL circuit structure comprising an IG-SIT injector 300 and an IG-SIT driver 301 is shown. The p-channel injector SIT 300 comprises a p+ type source region 311, an n-type region 312 and a p+ type drain region 313. The gate structure is formed with a gate electrode 314 formed on the n-type region 312 through an insulating layer 315. The n-channel driver SIT 301 is formed with an inversely operated IG-SIT which is formed along a V-shaped groove. The recessed gate structure as shown in FIG. 17c can also be applied to an IG-SIT, as will be described below. The driver SIT is formed with an n+ type source region 321, a p-type region 322, another p-type region 323, the n-type region 312 and an n+ type drain region 324. The gate structure is formed with a gate electrode 325 which is formed on (the righthand side of) the V-groove through an insulator film 326. The gate electrode extends over the source region 321, the p-type regions 322 and 323 and the n-type region 312. The insulator film 326' on the lefthand side of the V-groove has a sufficiently large thickness so as to induce no inversion layer thereunder. The p+ type drain region 313 of the injector IG-SIT 300 is connected to the gate electrode 325 of the driver IG-SIT 301. In the injector IG-SIT 300, a potential barrier is formed by the gap between the source region 311 and the gate electrode 314, while in the driver SIT 301, a potential barrier is formed by the different impurity concentrations $p_1$ and $p_2$ of the p-type layers 322 and 323.

Figure 18B:
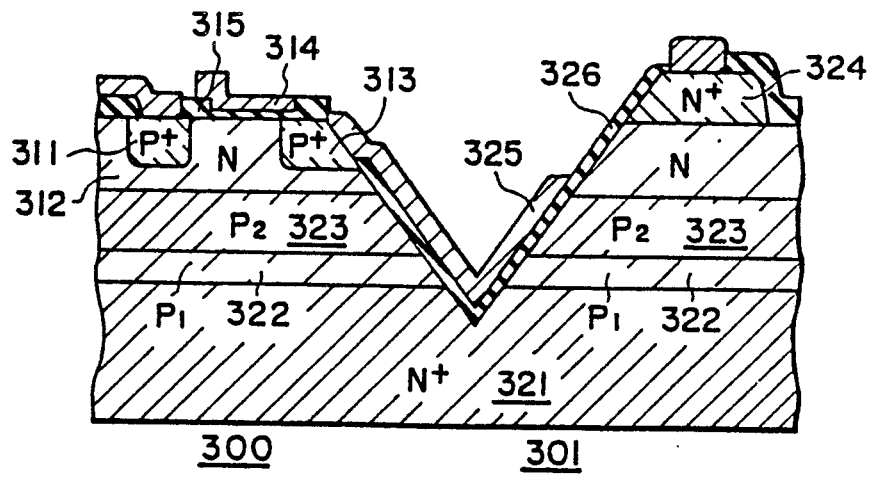

In FIG. 18b, an injector 300 is formed with an IG-SIT and a driver is formed with an inversely operated IG-SIT similar to the structure of FIG. 18a. In this structure, the insulating film 326 is thin on both the lefthand and the righthand sides of the V-groove to induce an inversion layer thereunder. Namely, the channel region 312 of the injector SIT is partially controlled by the potential of the n-type region 312 connected to the source region 321 through this inversion layer. In other words, an additional SIT is formed on the lefthand side of the V-groove.

The structure of FIG. 18b is basically similar to that of FIG. 18a in other respects. The additional SIT serves to bypass the injected current. In case the driver SIT is formed with an IG-SIT, it is not possible to inject carriers through the gate thereof. Thus, when the driver is formed with an insulated gate transistor, an injector transistor of a saturating characteristic cannot be used without providing an appropriate bypass as in this embodiment.

Figure 18C:
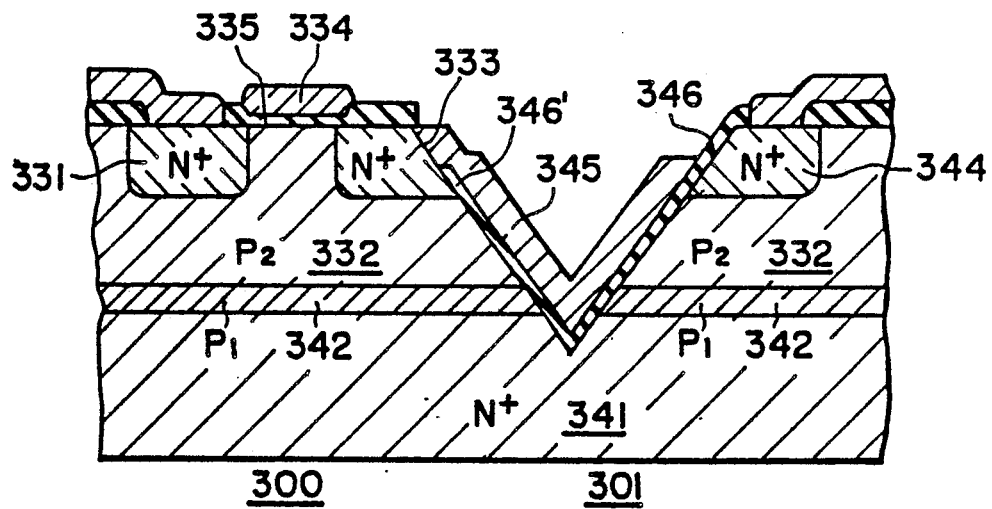

FIG. 18c shows an embodiment wherein the injector is an IG-FET and the driver is an IG-SIT. In this structure, the injector FET 300 is formed with an n-channel MOS-FET which comprises a drain region 331, a p-type region 332, an $n^+$ type region 333, a gate electrode 334 and an insulating film 335. The driver transistor 301 is a composite transistor, similar to the case of FIG. 18b. Furthermore, in the lefthand part of the V-groove, the insulating film 346' under the gate electrode 345 is designed to be sufficiently thin to induce an inversion layer when an input signal is applied to the gate electrode 345 (i.e. when the gate potential is raised). Thus, when the driver SIT 301 becomes conductive, the current which has been flowing in the preceding stage begins to flow into the source region 341 of the driver SIT through the inversion layer induced on the lefthand side of the V-groove. The lefthand part of the V-groove need not form an SIT, and there is also no need to divide the p-type region into two sections 342 and 332 on the lefthand side of the V-groove.

Figure 18D:
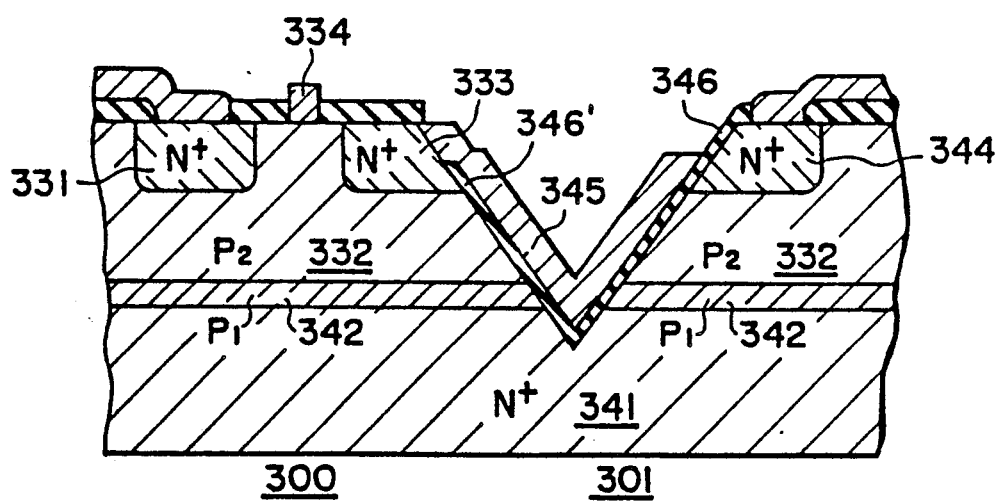

FIG. 18d shows an IIL structure in which the injector is formed with a bipolar transistor and the driver is formed with an IG-SIT. Except for use of a bipolar transistor, the structure of FIG. 18d is fundamentally similar to that of FIG. 18c.

When an IG-SIT is used as the driver transistor of an IIL circuit, the fan-out can be increased greatly in comparison to a bipolar driver transistor.

Although limited number of embodiments have been described hereinabove, various alteration and modifications are possible within the scope of the present invention. For example, all the conductivity types may be reversed, the insulator film may be formed with any insulating material, and combinations of the embodiments are possible. It will be also apparent that every kind of logic circuit can be formed by the combinations of the circuits disclosed herein.

The insulated gate static induction transistor according to the present invention has the distinguishing advantages over the conventional insulated gate field effect transistors that the parasitic capacitance can be suppressed to be very small and that a large output current can be derived. These features are particularly effective for forming a high-speed IC with a high integration density.

What is claimed is:

1. A semiconductor integrated circuit including at least two semiconductor elements at least one of which is formed with an insulated-gate static induction transistor, said transistor comprising:

a source semiconductor region of a first conductivity type including a portion having a high impurity concentration;

a source ohmic contact electrode formed on said source semiconductor region;

a drain semiconductor region of said first conductivity type including a portion having a high impurity concentration;

a drain ohmic contact electrode formed on said drain semiconductor region;

at least one channel semiconductor region of a second conductivity type opposite to said first conductivity type, disposed between said source and drain regions and having a low impurity concentration;

an insulated-gate structure including an insulating film formed on said channel semiconductor region and a conductive gate electrode formed on said insulating film;

said source and drain regions defining a controlled current path therebetween through a portion of said channel semiconductor region;

said source and channel regions including adjacent recessed portions wherein said insulated-gate structure is formed;

said channel region including at least first and second adjacent layers, said first layer having an impurity concentration higher than said second layer and the impurity concentration of the channel region under said insulating film being non-uniform overall;

said channel region including a first channel portion disposed adjacent to said source region and a second channel portion disposed between said first channel portion and said drain region, adjacent to said first channel portion, said first channel portion having an impurity concentration greater than the impurity concentration of said second channel portion; and means, including said insulating gate structure and said channel region with predetermined channel length and carrier concentration, for enabling the formation of a two-dimensional potential ridge coupled to both said gate electrode and said drain region in said first channel portion, whereby said transistor exhibits nonsaturating drain current-drain voltage characteristics which obey the exponential law;

said integrated circuit constituting at least one invertor including said insulated-gate static induction transistor.

2. A semiconductor integrated circuit as in claim 1 wherein said conductive gate electrode includes a first section having a first work function and a second section having a second work function.

3. A semiconductor integrated circuit as in claim 2 wherein said first section is disposed closer to said source region than said second section.

4. A semiconductor integrated circuit as in claim 1 wherein said insulating film includes a first section having a first dielectric constant and a second section having a second dielectric constant larger than said first dielectric constant.

5. A semiconductor integrated circuit as in claim 4 wherein said first section is disposed closer to said source region than said second region.

6. A semiconductor integrated circuit including at least two semiconductor elements at least one of which is formed with an insulated-gate static induction transistor comprising:
- a source semiconductor region of a first conductivity type including a portion having a high impurity concentration;
- a source ohmic contact electrode formed on said source semiconductor region;
- a drain semiconductor region of said first conductivity type including a portion having a high impurity concentration;
- a drain ohmic contact electrode formed on said drain semiconductor region;
- at least one channel semiconductor region of a second conductivity type opposite to said first conductivity type, disposed between said source and drain regions and having a low impurity concentration;
- an insulated-gate structure including an insulating film formed on said channel semiconductor region and a conductive gate electrode formed on said insulating film;
- said source and drain regions defining a controlled current path therebetween through a portion of said channel semiconductor region;
- said source and channel regions including adjacent recessed portions wherein said insulated-gate structure is formed;
- said channel region including at least first and second adjacent layers, said first layer having an impurity concentration higher than said second layer;
- said channel region including a first channel portion disposed adjacent to said source region and a second channel portion disposed between said first channel portion and said drain region, adhjacnet to said first channel portion, said first channel portion having an impurity concentration greater than the impurity concentration of said second channel portion;
- means, including said insulated gate structure and said channel region with predetermined channel length and carrier concentration, for enabling the formation of a two-dimensional potential ridge coupled to both said gate electrode and said drain region in said first channel portion, whereby said transistor exhibits nonsaturating drain current-drain voltage characteristics which obey the exponential law; and
- said integrated circuit constituting at least one injection integrated logic circuit including an injector transistor having at least one current output region, and an invertor transistor formed with said insulated-gate static induction transistor having said gate electrode connected to said current output region of said injector transistor.

7. A semiconductor integrated circuit as in claim 6 wherein said conductive gate electrode includes a first section having a first work function and a second section having a second work function.

8. A semiconductor integrated circuit as in claim 7 wherein said first section is disposed closer to said source region than said second section.

9. A semiconductor integrated circuit as in claim 6 wherein said insulating film includes a first section having a first dielectric constant and a second section having a second dielectric constant larger than said first dielectric constant.

10. A semiconductor integrated circuit as in claim 9 wherein said first section is disposed closer to said source region than said second region.

* * * * *